US009619593B1

(12) United States Patent
Aldrich

(10) Patent No.: US 9,619,593 B1
(45) Date of Patent: Apr. 11, 2017

(54) SYSTEM AND METHOD FOR IDENTIFYING AND REDUCING MODEL COMPLEXITIES AFFECTING MODEL VERIFICATION

(71) Applicant: The MathWorks, Inc., Natick, MA (US)

(72) Inventor: William J. Aldrich, Sudbury, MA (US)

(73) Assignee: The MathWorks, Inc., Natick, MA (US)

( * ) Notice: Subject to any disclaimer, the term of this patent is extended or adjusted under 35 U.S.C. 154(b) by 760 days.

(21) Appl. No.: 14/105,876

(22) Filed: Dec. 13, 2013

Related U.S. Application Data

(63) Continuation-in-part of application No. 13/744,681, filed on Jan. 18, 2013, now Pat. No. 8,615,385, which is a continuation of application No. 12/479,540, filed on Jun. 5, 2009, now Pat. No. 8,359,183.

(51) Int. Cl.
*G06F 7/60* (2006.01)
*G06F 17/10* (2006.01)
*G06F 17/50* (2006.01)

(52) U.S. Cl.
CPC ...... *G06F 17/5009* (2013.01); *G06F 17/5022* (2013.01)

(58) Field of Classification Search
CPC .................. G06F 17/5009; G06F 17/5022
See application file for complete search history.

(56) References Cited

U.S. PATENT DOCUMENTS

| 5,291,499 A | 3/1994 | Behrens et al. |
| 5,726,903 A | 3/1998 | Kerzman et al. |
| 5,958,073 A | 9/1999 | White |
| 6,366,300 B1 | 4/2002 | Ohara et al. |
| 7,295,961 B2 | 11/2007 | Root et al. |
| 7,490,032 B1 | 2/2009 | Koh et al. |
| 7,558,710 B1 | 7/2009 | Aldrich |
| 7,680,632 B1 | 3/2010 | Aldrich |
| 7,720,662 B1 | 5/2010 | Aldrich |
| 7,729,894 B1 | 6/2010 | Aldrich |

(Continued)

OTHER PUBLICATIONS

Aldrich, Bill, et al., "Managing Verification Activities Using SVM," Nov. 2004, pp. 1-15.

(Continued)

*Primary Examiner* — Aniss Chad
(74) *Attorney, Agent, or Firm* — Cesari and McKenna, LLP; Michael R. Reinemann

(57) ABSTRACT

An embodiment includes a computer-readable media storing instructions that when executed on processing logic execute a process for reducing complexity. The media stores instructions for identifying data dependencies in a model having executable semantics, the data dependencies affecting verification of the model and for selecting a location in the model, the location having data dependencies with other locations in the model, the location to be verified when the model is verified. The media also stores instructions for detecting complexities in the model, the complexities related to the selected location and presenting information about a source for at least one of the complexities. The media further stores instructions for eliminating the source for the at least one of the complexities and for transforming the model into an updated model based on the eliminating, the updated model not including the source for the at least one of the complexities.

25 Claims, 18 Drawing Sheets

(56) References Cited

U.S. PATENT DOCUMENTS

| | | |
|---|---|---|
| 7,941,299 B1 | 5/2011 | Aldrich |
| 8,046,708 B1 | 10/2011 | Aldrich |
| 8,234,105 B1 | 7/2012 | Aldrich et al. |
| 2004/0205507 A1 | 10/2004 | Tuschner et al. |
| 2008/0098349 A1 | 4/2008 | Lin et al. |
| 2011/0295578 A1 | 12/2011 | Aldrich et al. |

OTHER PUBLICATIONS

"Simulink® Design Verifier 1 : User's Guide," The MathWorks, Inc., May 2007, pp. i-xii, 1-1 to 1-20, 2-1 to 2-8, 3-1 to 3-18, 4-1 to 4-18, 5-1 to 5-16, 6-1 to 6-30, 7-1 to 7-28, 8-1 to 8-26, A-1 to A-14, 9-1 to 9-16, 10-1 to 10-28, 11-1 to 11-6, 12-1 to 12-14, Glossary-1 to Glossary-4, B-1 to B-2, and Index-1 to Index-2.

"Simulink® Verification and Validation 2 : User's Guide," The MathWorks, Inc., Sep. 2007, pp. i-xii, 1-1 to 1-6, 2-1 to 2-58, 3-1 to 3-32, 4-1 to 4-28, 5-1 to 5-66, 6-1 to 6-30, 7-1 to 7-4, 8-1 to 8-56, 9-1 to 9-4, 10-1 to 10-42, A-1 to A-4, and Index-1 to Index-4.

Unhelkar, Bhuvan, "Verification and Validation for Quality of UML 2.0 Models," Chapters 4-7, Aug. 2005, pp. 85-230.

```
1   IF (S2 > 0)
2       S6 = 3 * S1
3       S7 = S6
4   ELSE
5       S4 = 4 * S1
6       S7 = S4
7   END
8   S8 = S3 * S7
9   IF (S8 > B9_UL)
10      S9 = B9_UL
11  ELSEIF (S8 < B9_LL)
12      S9 = B9_LL
13  ELSE
14      S9 = S8
15  END
```

FIG. 6B

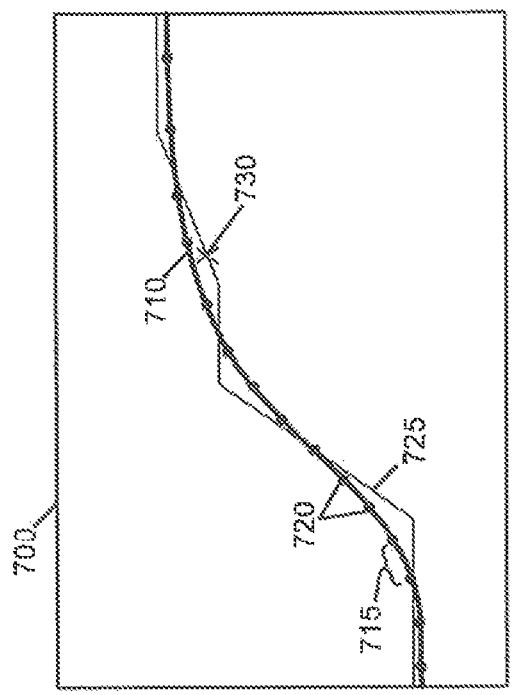

SYSTEM AND METHOD FOR IDENTIFYING AND REDUCING MODEL COMPLEXITIES AFFECTING MODEL VERIFICATION

RELATED APPLICATIONS

This application is a Continuation-in-Part (CIP) of application Ser. No. 13/744,681, filed Jan. 18, 2013 for a SYSTEM AND METHOD FOR IDENTIFYING AND REDUCING MODEL COMPLEXITIES AFFECTING MODEL VERIFICATION by William J. Aldrich, which is a Continuation of application Ser. No. 12/479,540, filed Jun. 5, 2009 for a SYSTEM AND METHOD FOR IDENTIFYING AND REDUCING MODEL COMPLEXITIES AFFECTING MODEL VERIFICATION by William J. Aldrich, now U.S. Pat. No. 8,359,183, which applications are hereby incorporated by reference in their entireties.

BACKGROUND INFORMATION

Models may be used to simulate physical systems. For example, a graphical model may be used to represent a complex control system for a plant. The graphical model may include entities, such as blocks, that reference executable code for performing operations of the control system when the graphical model executes. The blocks can vary in type and/or number and may be connected together to build large, complex models (e.g., models including hundreds or more interconnected blocks).

Users may have trouble grasping interactions among model entities as models become large and/or complex. For example, a user may inadvertently configure inputs to a block in a way that causes the block to operate in a nonlinear manner even though the user may have intended to configure the block so as to operate in a linear manner.

The user may attempt to verify operation of the model that includes the nonlinear behavior for the block. For example, the user may attempt to verify the operation of the model using a verification application that handles only linear operations. The verification application may produce an error when the user runs the application against the model that includes the nonlinear behavior. Equivalently a verification application may be capable of handling operations that are either linear or piecewise linear relationships of input variables and fail when a nonlinear relationship cannot be expressed as such a piecewise linear relationship.

The user may need to manually identify and correct the source of the nonlinear behavior before rerunning the verification application. Attempting to locate a source of model complexity, e.g., nonlinear behavior, can be difficult because some complexities can propagate from one entity to another. For example, if a first block outputs a nonlinear value to a second block, the second block may also output a nonlinear value after the second block processes the incoming value. A user attempting to identify the source of the nonlinear value, may mistakenly assume that the second block is the source of the nonlinear behavior when, in fact, it is a block that is upstream from the second block, namely the first block, that is the source of the nonlinear behavior.

Difficulties associated with identifying and remedying model complexities may impair the ability of users to verify and implement models containing complexities that impair model verification, such as nonlinear variables that are produced by nonlinear operations, lookup tables, timers, counters, pointer aliases, etc.

BRIEF DESCRIPTION OF THE DRAWINGS

The accompanying drawings, which are incorporated in and constitute a part of this specification, illustrate one or more embodiments of the invention and, together with the description, explain the invention. In the drawings.

FIG. 6B illustrates a pseudo code segment for the model of FIG. 6A;

FIG. 7 illustrates an exemplary look-up table having a large number of intervals together with an approximation for the lookup table;

DETAILED DESCRIPTION

Figure 1:
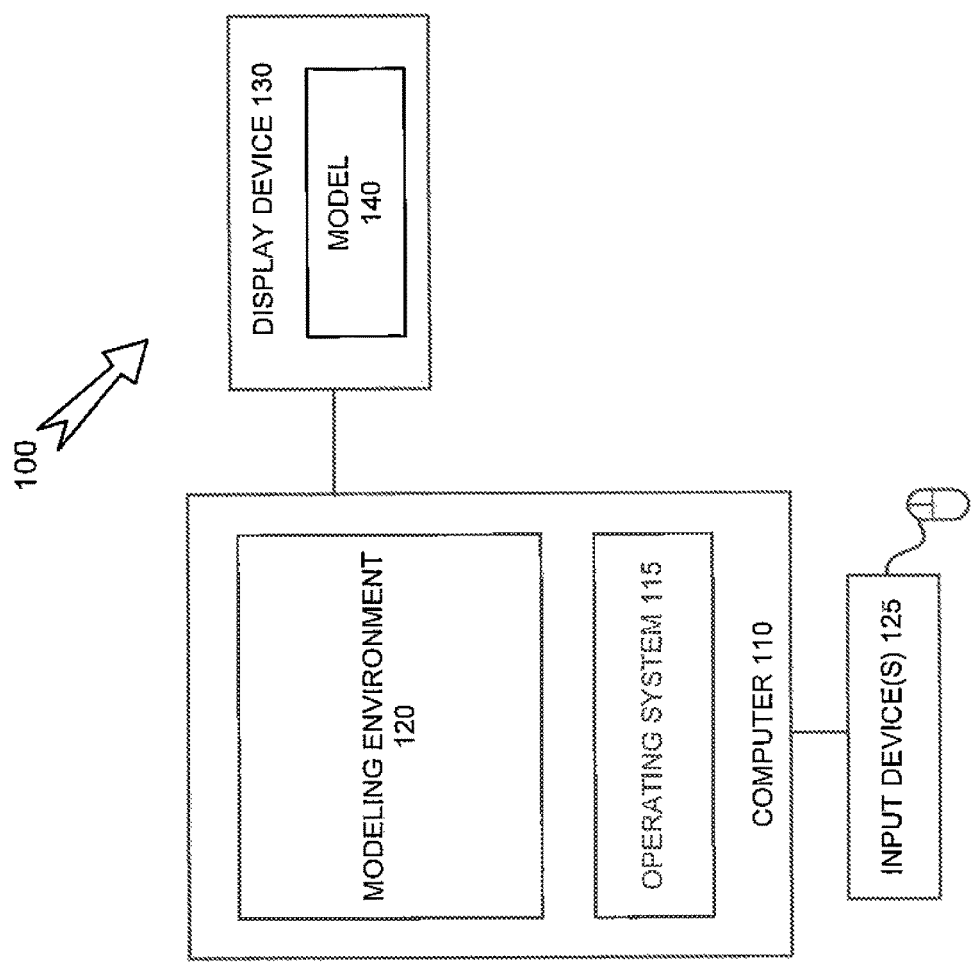
FIG. 1 illustrates an exemplary system for practicing an embodiment.

The following detailed description of implementations consistent with principles of the invention refers to the accompanying drawings. The same reference numbers in different drawings may identify the same or similar elements. Also, the following detailed description does not limit the invention. Instead, the scope of the invention is defined by the appended claims and their equivalents.

OVERVIEW

Users can unintentionally introduce complexities into models when users create the models. A complexity may be anything that interferes with successfully analyzing a model, such as data values that cause model analysis activities to produce errors. For example, a complexity may interfere with model verification activities and may cause these activities to produce errors. Assume, for sake of example, a user creates a model of a control system and the control system includes a multiplier block that receives two inputs that can vary. The user may not realize that a multiplier having two varying inputs may perform nonlinear operations that cause nonlinear output values under certain conditions. Complexities can also arise from a combination on model elements (e.g., entities or relations). For example, neither a variable may nor a multiplier may be sources of a complexity (e.g., a nonlinearity) themselves; however if the variable is combined with the multiplier, the combination may produce a complex (e.g., nonlinear) behavior in a model. When a complexity is identified in a model, constructs causing the complexity are identified and these constructs can include one or more variables, model components, etc.

When the user performs a verification activity against the control system (discussed above) to verify operation of the control system, the verification effort may fail because of the nonlinear values output from the multiplier. The user may attempt to identify the source of the nonlinear value and/or of a nonlinear operation that produces the nonlinear value when the verification fails, and he may find it difficult and time consuming to locate the cause of the nonlinear value/ operation. The difficulty can arise because a nonlinear value output from the multiplier can be used by downstream blocks, which can cause the downstream blocks to also produce nonlinear values. If the user is attempting to verify one of the downstream blocks, he may not realize that the block being verified is not the actual cause of the nonlinear value, but rather is an effect of an upstream block outputting nonlinear values.

Exemplary embodiments can eliminate complexities from models by identifying a source for a complexity and modifying the source such that the source does not exhibit complex behavior when the model executes. For example, referring to the control system above, an application may be run against the control system, and the application may evaluate the downstream block on which verification activities will be performed. The application may determine that the downstream block outputs nonlinear values. The application may then identify blocks sharing dependencies with the downstream block (e.g., data dependencies). The application may evaluate these blocks to determine whether they output nonlinear values. The application may continue to evaluate other blocks in the model based on dependencies until blocks producing only piecewise linear values are identified.

Once linear blocks are detected, the application may identify the block (e.g., the multiplier block in the control system) that causes the nonlinearity. The application may evaluate the inputs to the multiplier and determine that both inputs vary, which causes the nonlinear value to be output from the multiplier. The application may eliminate one of the varying inputs by replacing the varying input with a constrained input, such as a constant, to produce a multiplier that includes a single input that varies. The multiplier may produce only linear values when one of its inputs is constrained, thus removing the complexity caused by the multiplier and two varying inputs.

The user may run a verification application on the model after the varying input to the multiplier has been replaced with a constrained input. The user may obtain a valid verification result for a downstream block once the nonlinear behavior of the multiplier has been eliminated.

Exemplary embodiments can be adapted to handle substantially any type of complexity in a model, such as lookup tables, timers, nonlinear operations, pointer aliases, combinatorial explosions, sequential logic, functions with side-effects, etc. Embodiments can eliminate complexities from models using a number of techniques, such as discretizing a complexity to simplify mathematics for handling the complexity, eliminating the complexity by replacing the complexity with another value or operation, etc. These embodiments may further tag and/or propagate complexities, or information about complexities, to facilitate identifying and eliminating complexities from models.

Exemplary embodiments can further process user inputs to identify a portion of a model on which to perform verification activities, to select a technique for eliminating an identified type of complexity, to initiate evaluation of complexities in a model, etc. In other implementations, programmatic instructions may be used to automatically perform operations that can otherwise be initiated by a user. Embodiments can output results of model evaluations, complexity elimination activities, verification activities, etc., via reports, graphical user interfaces, data structures, etc. In some implementations, these results may be used by other applications to perform additional processing activities.

As disclosed herein, a nonlinear value results from a nonlinear operation, a piecewise linear value results from a piecewise linear operation and a linear value results from a linear operation.

Exemplary System

FIG. 1 illustrates an exemplary system 100 for practicing an embodiment. For example, system 100 may be used to construct a model that includes one or more entities, to remove complexities in the model, and/or to verify the model. System 100 may include computer 110, operating system 115, modeling environment 120, input device 125, display device 130 and model 140. The system in FIG. 1 is illustrative and other embodiments of system 100 can include fewer devices, more devices, and/or devices in configurations that differ from the configuration of FIG. 1.

Computer 110 may include a device that performs processing operations, display operations, communication operations, etc. For example, computer 110 may include logic, such as one or more processing or storage devices, that can be used to perform and/or support processing activities on behalf of a user. Embodiments of computer 110 may include a desktop computer, a laptop computer, a client, a server, a mainframe, a personal digital assistant (PDA), a web-enabled cellular telephone, a smart phone, smart sensor/actuator, or another computation or communication device that executes instructions to perform one or more activities and/or to generate one or more results.

Computer 110 may further perform communication operations by sending data to or receiving data from another device (not shown in FIG. 1). Data may refer to any type of machine-readable information having substantially any format that may be adapted for use in one or more networks and/or with one or more devices. Data may include digital information or analog information. Data may further be packetized and/or non-packetized.

Operating system 115 may manage hardware and/or software resources associated with computer 110. For example, operating system 115 may manage tasks associated with receiving user inputs, operating computing environment 110, allocating memory, prioritizing system requests, etc. In an embodiment, operating system 115 may be a virtual operating system. Embodiments of operating system 115 may include Linux, Mac OS, Microsoft Windows, Solaris, UNIX, etc. Operating system 115 may further run on a virtual machine, which can be provided by computer 110.

Modeling environment 120 may provide a computing environment that allows users to perform simulation or modeling tasks related to disciplines, such as, but not limited to, mathematics, science, engineering, medicine, business, etc. Modeling environment 120 may support one or more applications that execute instructions to allow a user to construct a model having executable semantics. In an embodiment, modeling environment 120 may execute the model to produce a result.

Input device 125 may include logic to receive user inputs. For example, input device 125 may transform a user motion or action into a signal or message that can be interpreted by computer 110. Input device 125 can include, but is not limited to, keyboards, pointing devices, biometric devices, accelerometers, microphones, cameras, haptic devices, etc.

Display device 130 may display information to a user. Display device 130 may include a cathode ray tube (CRT), plasma display device, light emitting diode (LED) display device, liquid crystal display (LCD) device, etc. Embodiments of display device 130 may be configured to receive user inputs (e.g., via a touch sensitive screen) if desired. In an embodiment, display device 130 can display one or more graphical user interfaces (GUIs) to a user. The GUIs may include model 140 and/or other types of information.

Model 140 may include information for a textual or graphical model. For example, model 140 may include information for textual models or graphical models that can be time-based models (e.g., differential equation models, difference equation models or discrete-time models with or without algebraic constraints, etc.), event-based models, state transition models, data flow models, component diagrams, entity flow diagrams, equation based language diagrams, etc.

Exemplary Modeling Environment

Figure 2:
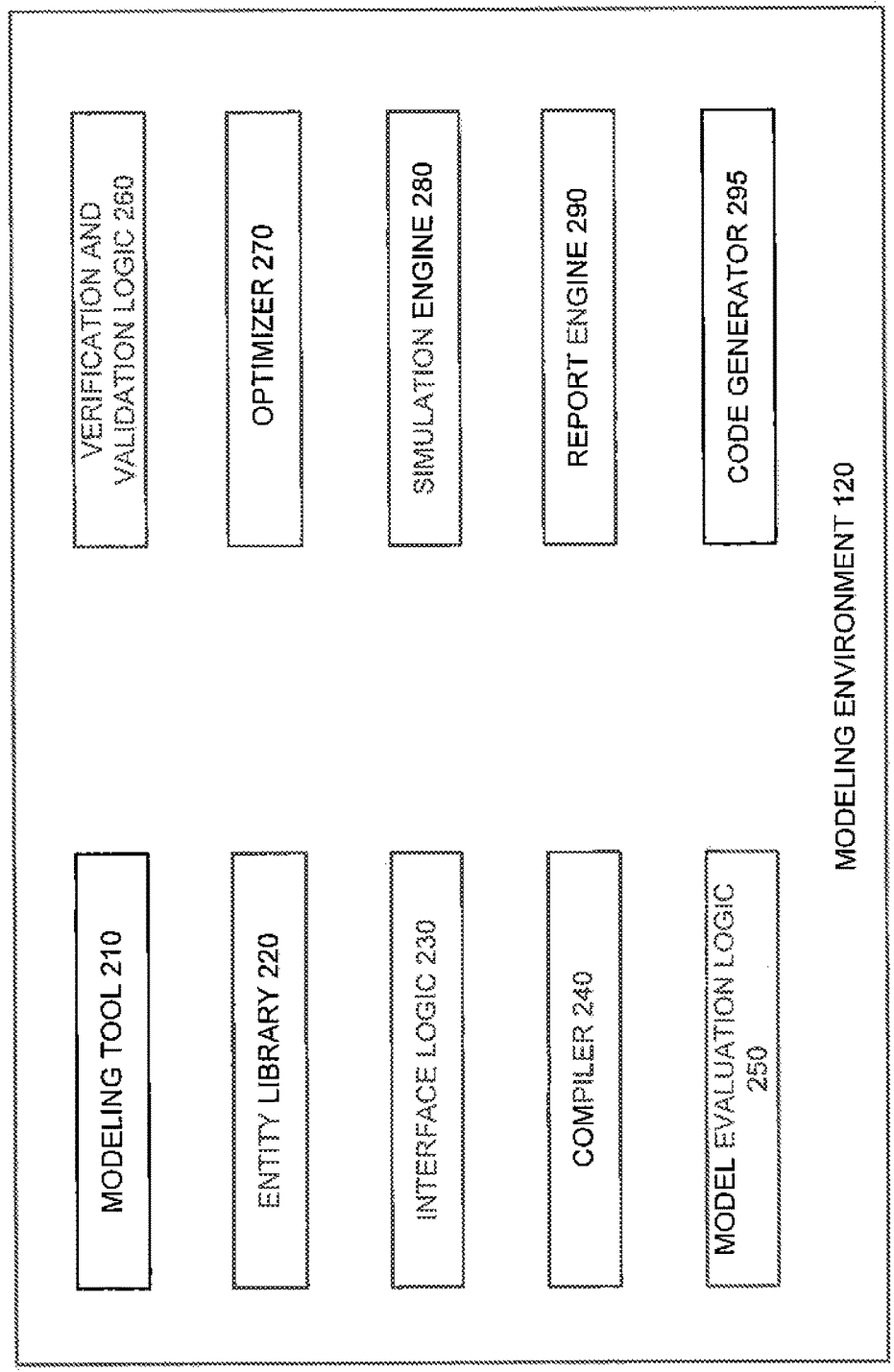
FIG. 2 illustrates an exemplary embodiment of a modeling environment.

FIG. 2 illustrates an exemplary embodiment of a modeling environment 120. Modeling environment 120 can include modeling tool 210, entity library 220, interface logic 230, compiler 240, model evaluation logic 250, verification and validation logic (V&V logic) 260, optimizer 270, simulation engine 280, report engine 290, and code generator 295. The embodiment of modeling environment 120 illustrated in FIG. 2 is illustrative and other embodiments of modeling environment 120 can include more entities or fewer entities without departing from the spirit of the invention.

Modeling tool 210 may be an application for building a model. Modeling tool 210 can be used to build a textual model or a graphical model having executable semantics. In the case of graphical models, modeling tool 210 may allow users to create, modify, diagnose, delete, etc., model entities and/or connections. Modeling tool 210 may interact with other entities illustrated in FIG. 1 or 2 for receiving user inputs, executing a model, displaying results, generating code, etc.

Entity library 220 may include code modules or entities, e.g., blocks/icons, and/or connections (e.g., lines) that a user can drag and drop into a display window that includes a model. In the case of graphical models, a user may further couple entities using connections to produce a graphical model of a system.

Interface logic 230 may allow modeling environment 120 to send or receive data and/or information to/from devices (e.g., a target environment) or software modules (e.g., an application program interface).

Compiler 240 may compile a model into an executable format. Compiled code produced by compiler 240 may be executed on computer 110 to produce a modeling result. In an embodiment, compiler 240 may also provide a user with debugging capabilities for diagnosing errors associated with the model and profiling capabilities for analyzing performance characteristics.

Model evaluation logic 250 can perform analyses on models to identify and remove model complexities. Evaluation logic 250 may allow a user to select a model entity or segment of code and evaluate the selected entity/segment to determine if a model complexity impacts the selected entity/segment. Evaluation logic 250 may further identify dependencies between the selected entity/segment and other entities or segments in the model. Evaluation logic 250 may determine whether the other entities/segments are a cause for model complexity or are exposed to model complexity because of other entities or segments in the model. When a source of model complexity is identified, evaluation logic 250 can eliminate the complexity by modifying the complexity with an entity, segment, value, etc., that does not include the complexity. In some embodiments, modifying the complexity can include replacing the complexity with an entity, segment, value, etc. that is not complex.

In an embodiment, evaluation logic 250 may create a data structure, such as a list, when performing evaluation activities on a model. Evaluation logic 250 may populate the data structure with information about entities/segments in the model and information about complexities associated with the entities/segments. Evaluation logic 250 may use information from the data structure when modifying a complexity in the model with an entity, segment, etc., that is not complex. Evaluation logic 250 may interact with V&V logic 260 to, for example, indicate that complexities have been removed from the model and to allow verification activities to be performed on the model once complexities are removed.

V&V logic 260 may perform verification and/or validation activities for a model created using modeling tool 210. In an embodiment, V&V logic 260 may include a number of verification modules that can be selected based on the type of model being verified. Verification modules may comprise code for performing verification operations on a model. For example, a first verification module may be used to verify a model in which nonlinear inputs have been replaced by constants, and a second verification module may be used to verify the model when a time delay has been eliminated from the model.

Verification refers to activities performed for insuring that requirements for a model have been satisfied. For example, a model may have requirements that need to be met in order for the model to be considered valid for a particular application. Verification activities may be performed, e.g., by running test cases against the model, to determine whether the requirements are satisfied by the model. Validation may refer to knowing that requirements for the model are correct. For example, a valid model may be a model that meets an intended use.

Embodiments of V&V logic 260 may be configured to verify models that have had substantially any type of complexity eliminated from them. For example, V&V logic 260 can interact with a model that has had complexities such as nonlinear values, lookup tables, timers, floating point operations, pointer aliases, etc., removed therefrom. Embodiments of V&V logic 260 can further be configured to include test generating logic for generating tests used on a model and/or property proving logic for performing property proving on the model. V&V logic 260 may interact with report engine 280 to output verification and/or validation results, e.g., to output results to a user.

Optimizer 270 may optimize code for a model. For example, optimizer 270 may optimize code to cause the code to occupy less memory, to cause the code to execute more efficiently, to cause the code to execute faster, etc., than the code would if the code were not optimized. In an embodiment, optimizer 270 may operate with or may be integrated into compiler 240, code generator 295, etc.

Simulation engine 280 may perform operations for executing a model to simulate a system. Simulation engine 280 may be configured to perform standalone or remote simulations based on user preferences or system preferences.

Report engine 290 may produce a report based on information in modeling environment 120. For example, report engine 290 may produce a report indicating where model complexities have been modified, a report indicating whether a verification activity was successful, a report indicating whether a model compiled properly, etc. Embodiments of report engine 290 can produce reports in an electronic format for display on display device 130, in a hardcopy format, and/or a format adapted for storage in a storage device.

Code generator 295 can generate code from a model. In an embodiment, code generator 295 may receive code in a first format and may transform the code from the first format into a second format. In an embodiment, code generator 295 can generate source code, assembly language code, binary code, interface information, configuration information, performance information, task information, etc., from at least a portion of a model. Optimizer 270 can interact with code generator 295 to generate code that is optimized according to a parameter (e.g., memory use, execution speed, multiprocessing, etc.).

For example, code generator 295 can generate C, C++, SystemC, Java, Structured Text, etc., code from the model. Embodiments of code generator 295 can further generate Unified Modeling Language (UML) based representations and/or extensions from some or all of a graphical model (e.g., System Modeling Language (SysML), Extensible Markup Language (XML), Modeling and Analysis of Real Time and Embedded Systems (MARTE), Hardware Description Language (HDL), Automotive Open System Architecture (AUTOSAR), etc.).

Exemplary Graphical Model

Figure 3:
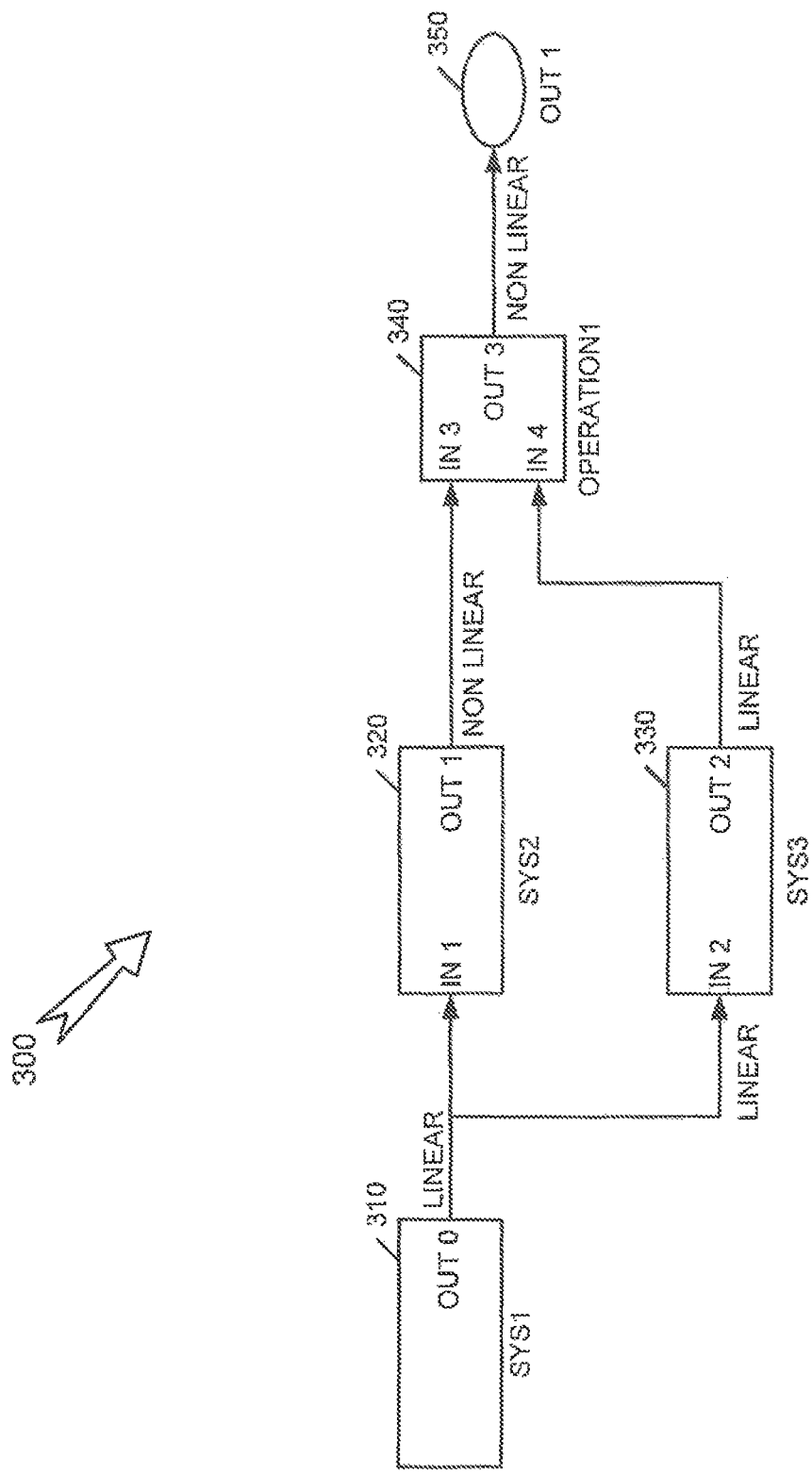
FIG. 3 illustrates an exemplary model that includes complexities in the form of nonlinearities.

FIG. 3 illustrates an exemplary graphical model 300 that includes complexities. Model 300 may include one or more blocks that represent entities in the model. In some embodiments, the blocks may represent executable code, that when executed simulates the model. Model 300 includes three blocks that represent systems, system 1 (SYS1) 310, system 2 (SYS2) 320, and system 3 (SYS3) 330, a block that represents an operation, operation1 340, and an output block (OUT 1) 350.

Blocks 310, 320, and 330 can represent systems that are used in model 300. For example, blocks 310, 320, and 330 may represent subsystems in an embodiment of model 300. In FIG. 3, SYS 1 310 outputs a linear value via output port OUT 0. SYS2 320 and SYS3 330 receive the linear value via input ports IN 1 and IN 2, respectively. SYS2 320 processes the linear value and produces a nonlinear value that is output from SYS2 320 via output port OUT 1. In contrast, SYS3 330 processes the linear value and produces an output value that is linear. SYS3 330 outputs the linear value via output port OUT 2.

Still referring to FIG. 3, operation1 340 receives the nonlinear value from SYS2 320 via input port IN 3 and receives the linear value from SYS3 330 via input port IN 4. Operation1 340 processes the linear value received via IN 4 and the nonlinear value received IN 3 and produces a nonlinear value. For example, operation1 340 may perform a multiplication, division, trigonometric, coordinate transformation, etc., operation on the incoming signals. Operation1 340 makes the nonlinear value available to OUT 1 350 via output port OUT 3. OUT 1 350 may cause the nonlinear value to be stored in a storage medium.

In FIG. 3, SYS2 320 is the source of the nonlinear value since SYS2 320 causes the nonlinear value to occur. In contrast, when operation1 340 is a linear operation, operation1 340 propagates the nonlinear value to downstream entities, e.g., OUT 1 350; however, operation 1 340 does not cause the nonlinear value. In contrast, when operation1 340 performs a nonlinear operation (e.g., a multiplication operation on two varying inputs), operation1 340 may also be a source of model complexity.

Embodiments of models described herein can include blocks that are sources for complexities, such as nonlinear values, lookup tables having a large number of intervals, timers, counters, etc. In addition, models described herein may include blocks that, while not causing complexities, do propagate complexities to downstream blocks. Exemplary embodiments can be configured to identify and modify all sources of model complexity along a path of computation so as to eliminate model complexity along the path of execution once modification activities are performed on a model.

In some models, such as large models, it may become difficult for a user to determine which block caused a complexity (e.g., nonlinear value) to occur since the complexity can be propagated to other blocks in the model. Embodiments of the invention can detect complexities and can identify both the cause of a complexity and entity affected by the complexity, e.g., blocks that receive and propagate the complexity. In some embodiments, the complexities can be detected automatically and in other embodiments the complexities can be detected using information received from a user.

Exemplary Nonlinear Model Entity

Figure 4:
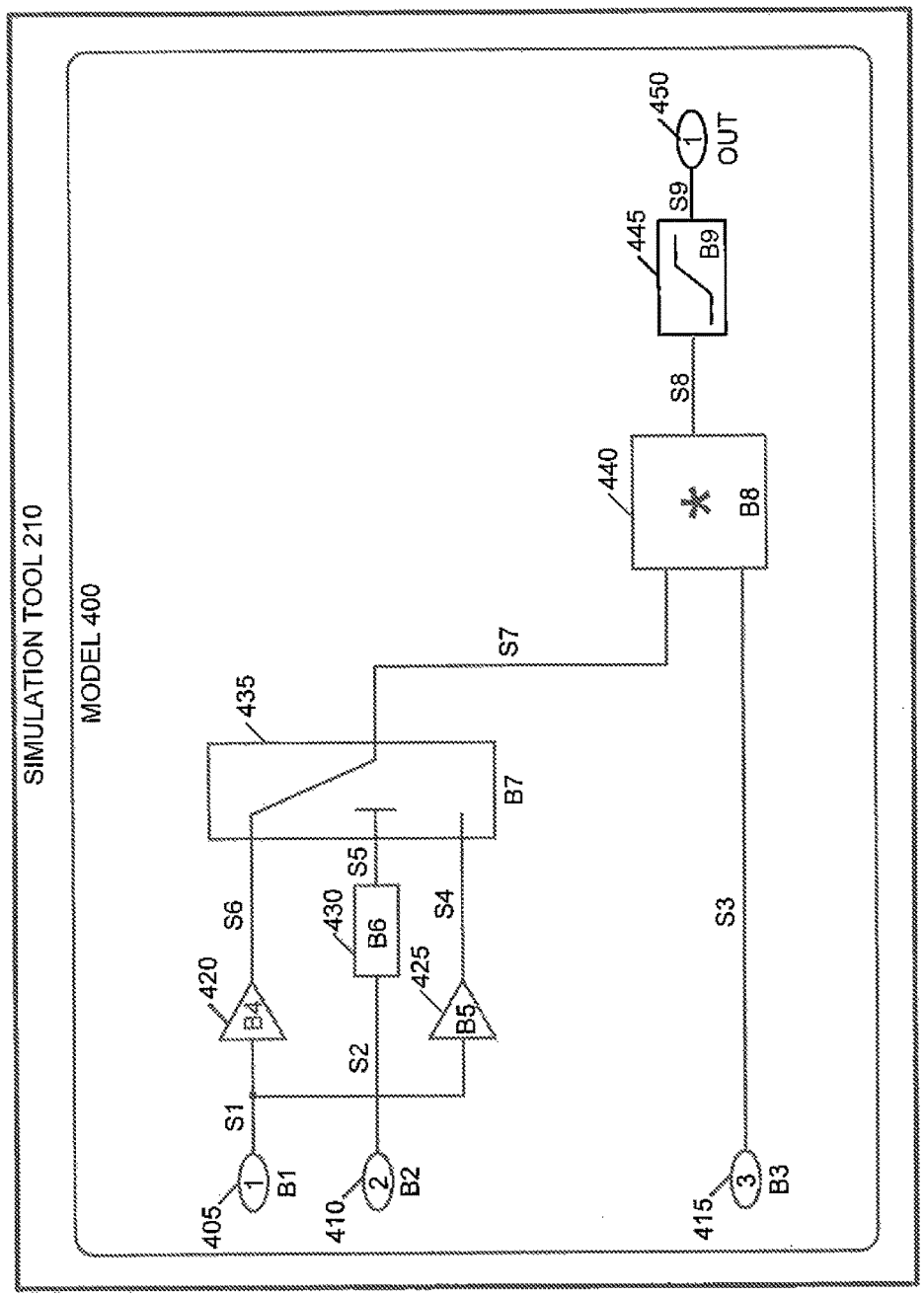
FIG. 4 illustrates an exemplary model having a structure that can contribute to model complexities.

FIG. 4 illustrates an exemplary model 400 that includes an entity that can produce nonlinear output values. Modeling tool 210 can be used to display model 400 that includes inputs 405, 410, and 415, gain blocks 420 and 425, subsystem block 430, switch block 435, multiplier block 440, saturation block 445 and output block 450. Input blocks 405, 410, and 415 may provide signals to other entities in model 400. For example, B1 405 may provide a signal to blocks 420 and 425, B2 410 may provide a signal to block 430, and B3 415 may provide a signal to block 440.

Block 420 may amplify signal, S1, to produce an amplified signal, S6, that is input to block 435. Block 435 may switch one of a plurality of inputs to an output port, and in FIG. 4, block 435 switches S6 to the output port as signal S7. Block 430 may receive S2 and may output S5 after processing S2. S5 may be provided to block 435 as a decision signal that is used to determine whether S6 is switched to the output port of block 435 or whether signal S4 is switched to the output port of block 435. Block 425 may receive S1 and may amplify S1 to produce S4. S4 may be provided to an input port of block 435; however, this input port is not connected to the output port in FIG. 4.

In FIG. 4, B1 405, B2 410 and B3 415 may not be constrained in terms of signals that these input ports produce; and, therefore, signals S1, S2, and S3 may vary freely. S7 and S3 may be provided to block 440, where block 440 applies a multiplication operation to the freely varying signals S7 and S3. Multiplying S7 and S3 may have complicating consequences, namely producing a model complexity in the form of a nonlinear output signal, denoted as S8.

S8 may be provided to block 445, which may cause block 445 to produce a nonlinear signal, S9, at the output of block 445. In FIG. 4, block 445 may propagate a nonlinear input signal to a downstream entity, such as output 450. A user attempting to verify the operation of model 400 with a verification application may receive an error since the verification application may not be able to handle nonlinear signals and/or may not be able to distinguish which block in FIG. 4 is the source of the nonlinear signal value.

Exemplary embodiments may provide a user with information regarding techniques for eliminating complexities from a model. For example, referring to FIG. 4, an embodiment may provide a message to a user that indicates block 440 is a source for a nonlinear signal that is provided to block 445. The embodiment may further inform the user that block 440 or the use of block 440 can be modified to eliminate the nonlinear behavior. For example, block 440 may be modified when block 440 is replaced. Or, a use of block 440 can be modified when an input to block 440 is modified, e.g., by replacing one input with a constant.

Figure 5B:
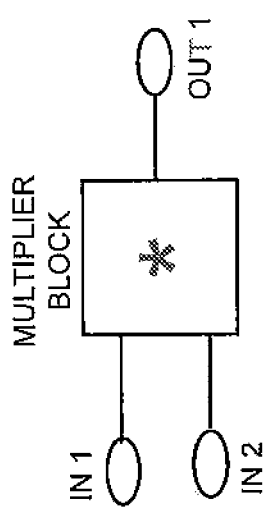
FIG. 5B illustrates the entity of FIG. 5A reconfigured to eliminate complexities associated with the entity.
Figure 5A:
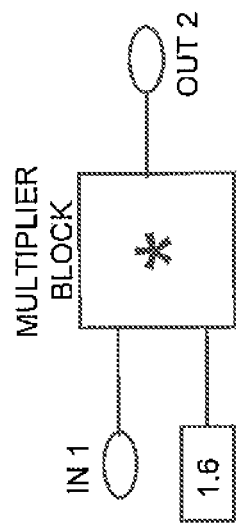
FIG. 5A illustrates an exemplary entity that can contribute to complexities in a model.

FIGS. 5A and 5B illustrate a technique for eliminating complexities from model 400. Referring to FIG. 5A, an embodiment may provide the user with a window that includes an illustration of a multiplier block having a configuration that matches the configuration used for block 440 in model 400. For example, S7 may relate to IN 1, S3 may relate to IN 2, and S8 may relate to OUT 1 in FIG. 5A. Block 440 (FIG. 4) includes two inputs that can vary freely, and the multiplier block of FIG. 5A also includes two inputs that can vary freely.

The technique may further provide a window (e.g., a GUI) that displays a technique that can be used to eliminate the complexity from model 400. For example, the image of FIG. 5B can be displayed to the user. FIG. 5B illustrates the multiplier block of FIG. 5A; however, input IN 2 is replaced with a constant value of 1.6. Replacing IN 2 with a constant value will eliminate the nonlinear output situation of FIG. 4.

When a user elects to replace block 440 with a multiplier block having one input that is a constant value, model 400 may become a linear model. The user may be able to run a verification application against model 400 to obtain a meaningful verification result when one of the inputs for block 440 is a constant value.

Exemplary Technique

Embodiments may perform analyses of a model to determine whether variables in a model can introduce complexities. For example, model 400 (FIG. 4) can be implemented using code that, when executed, performs operations associated with blocks in model 400.

Figure 6A:
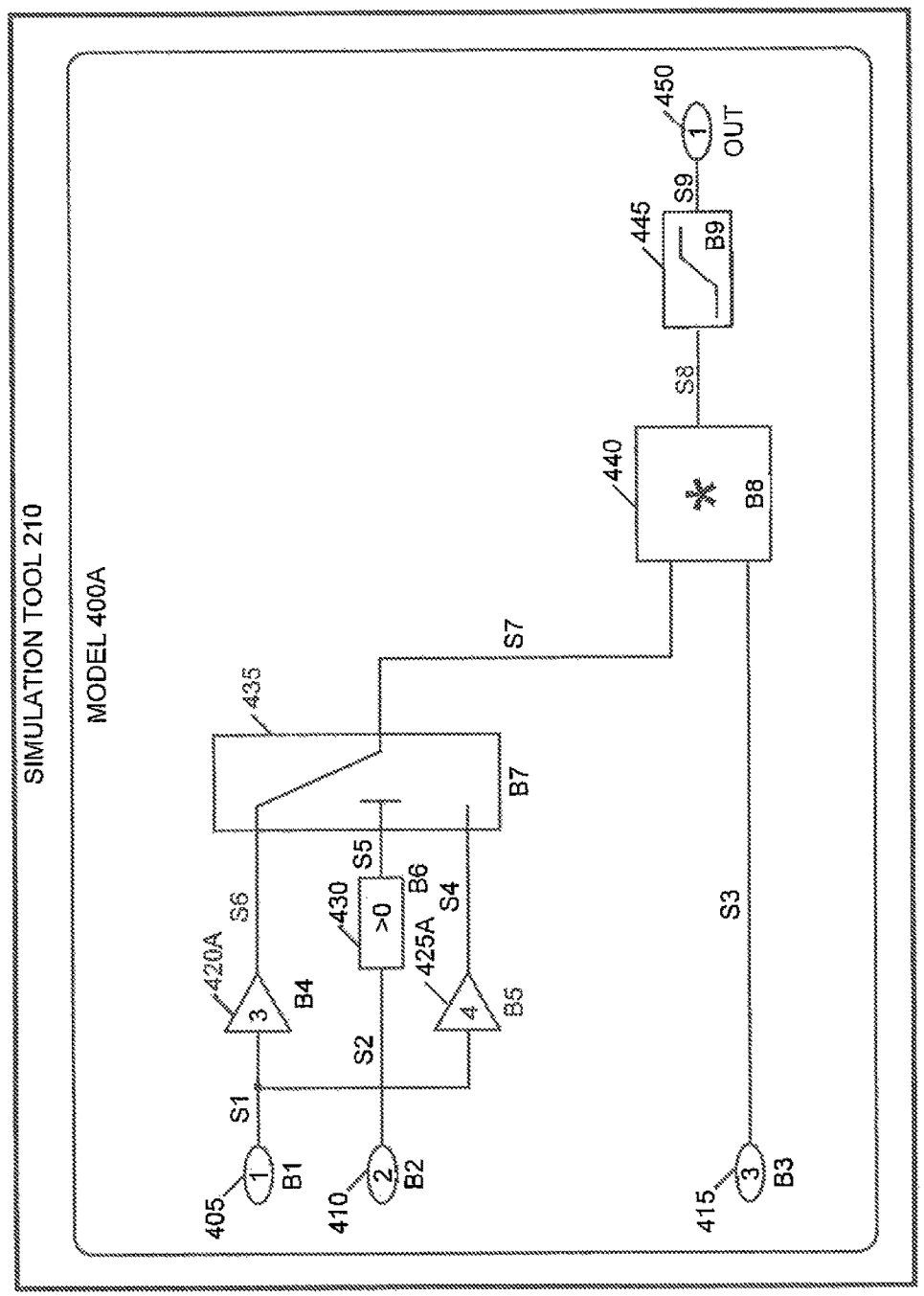
FIG. 6A illustrates a model that can exhibit complex behavior when the model executes.

FIG. 6A provides model 400 (model 400A in FIG. 6A) with gain values selected for entities 420 and 425, denoted as gain block 420A and 425A, respectively. In FIG. 6A, block 420A provides a gain of 3 and block 425A provides a gain of 4. In FIG. 6A, saturation block 445 can have an upper limit specified as B9_UL and a lower limit specified as B9_LL. Block 445 may be configured to pass input values to an output port when an input value satisfies B9_LL<input value<B9_UL. Code for implementing functionalities of model 400A can be written as illustrated in FIG. 6B.

In FIG. 6B, a segment of pseudo code describing functionality of model 400A is provided. In FIG. 6B, input variables S1, S2, and S3 can be freely set and may be tagged as linear in an embodiment. Other input variables, such as S6 (line 2, FIG. 6B) and S4 (line 5, FIG. 6B) can be defined from an expression of inputs. In FIG. 6A, S6 and S4 may be defined from a linear expression of inputs and therefore may be linear. For example, S6 is defined as a constant gain (3) multiplied by a varying input S1; and S4 is defined as a constant gain (4) multiplied by a varying input S1.

In FIG. 6B, other variables, such as S7, may be defined by two or more other values or expressions. For example, S7 is defined in line 3 as being equal to S6 and in line 6 as being equal to S4. The linearity of S7 is therefore dependent on whether S6 and S4 are linear. Analyses of S7 may determine that: (1) all expressions defining S7 are linear functions, and (2) all control flow expressions that determine which function is used to determine S7 are also linear. The analyses may determine that S7 is a linear function of inputs given (1) and (2) above.

Exemplary embodiments can be configured to automatically and symbolically replace each variable used in an expression by all possible definitions of the variable. When this technique is applied to an entire design, it can be determined whether a particular variable is a linear expression of inputs or a nonlinear expression of inputs.

For example, referring to FIG. 6B, an embodiment may determine that S8 (line 8) is a nonlinear function of inputs since S8 is defined as S3*S7. The embodiment may further determine that expressions using S8 are also nonlinear functions of inputs due to the nonlinear nature of S8. For example, the expressions on line 9 and line 11 are nonlinear since these expressions each use S8.

If the pseudo code in FIG. 6B were analyzed using a technique that required linear or piecewise linear relationships (e.g., generating tests using a linear-programming solver), the requirements of the analysis may attempt to achieve the expressions on lines 1, 9 and 11 to be evaluated as both TRUE and FALSE at different steps of the evaluation in generated test cases. In this situation, the nonlinear expression from B7 (line 8 in FIG. 6B) may make test generation impossible for the expressions on lines 9 and 11 if, for example, predicate solving is being performed with the linear solver. Exemplary embodiments of the invention can overcome shortcomings, such as those discussed immediately above, by eliminating complexities (e.g., nonlinear variables) before model verification activities are performed.

For example, an embodiment can capture symbolic information about data dependencies and can identify and/or suggest modifications that can be made to model 400A to make the model better suited to analysis and/or verification. Referring again to FIG. 6B, the expression on line 8 can be made linear in an embodiment by forcing S3 or S7 to be constant, or limited to a finite set of constant values. The embodiment may further determine that S7 can be made into a finite set of constant values by making S1 constant. The embodiment may determine that applying constraints to S3 or S7 renders model 400A linear.

The discussion of FIGS. 6A and 6B has discussed model complexities in the form of nonlinearities; however, embodiments of the invention can be configured to address other types of model complexities, such as lookup tables. By way of example, assume that input 415 is replaced with a lookup table that includes a large number of intervals, such as several thousand intervals. Analysis of signals S6, S7, S8 and S9 will become more complicated due to the large number of intervals in the lookup table. An embodiment may remove complexities associated with the lookup table by resampling input/output relationships of the lookup table into a number of intervals that is fewer than the number of intervals in the original lookup table. Although, resampling the lookup table may reduce accuracy of model 400A; however, the reduced accuracy may be an acceptable tradeoff when the simplified model allows verification activities to be successfully performed on model 400A within a reasonable period of time.

Exemplary Lookup Table

FIG. 7 illustrates an exemplary lookup table 700 that can be used with model 400A (FIG. 6A). Lookup table 700 may include a set of interpolation intervals 715 that can become numerous in some applications. Intervals 715 may include a number of values 720 that can be selected and used by model 400A during execution. Values 720 may fall along a line 710 that can be fit through values 720. In some situations, a large number of intervals 715 may introduce large amounts of complexity in model 400A by forcing analysis techniques to consider each of the numerous interpolation intervals.

An embodiment may perform dependency analysis on entities in model 400A (FIG. 6A) and may determine that lookup table 700 is a source of complexity in model 400A. The embodiment may eliminate the complexity associated with lookup table 700 by approximating intervals 715 using fewer intervals. For example, an embodiment may use approximation 725 to represent the intervals 715 making up lookup table 700. In the embodiment of FIG. 7, approximation 725 may contain significantly fewer intervals as compared to the number of intervals 715 in the original lookup table. The reduced number of intervals in approximation 725 may reduce the complexity associated with lookup table 700 when model 400A is analyzed. A value 730 on approximation 725 may be used to approximate a value in lookup table 700 that resides along line 710, where the lookup table value along line 710 is proximate to value 730.

Exemplary User Interface

Figure 8:
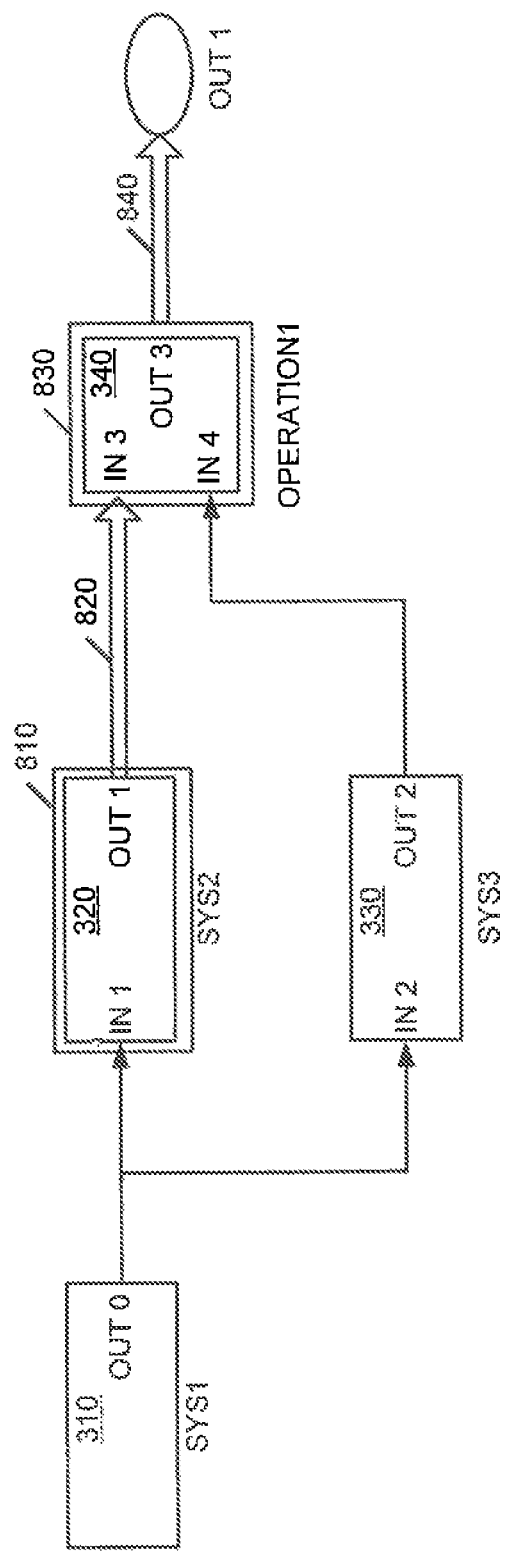
FIG. 8 illustrates an exemplary display technique that can be used to identify model entities affected by complexities.

FIG. 8 illustrates an exemplary user interface that can be used to display model complexity information to a user. The user interface includes the entities of model 300 and illustrates a display technique that can be used to indicate portions of a model causing model complexities. For example, a user may create model 300 and may initiate an application, via evaluation logic 250, that performs dependency analysis on the model. The dependency analysis may evaluate entities and/or input/output variables and may determine which entities and variables add complexity to model 300.

In FIG. 8, SYS2 320 and operation1 340 are indicated using a display technique 810 and 830, respectively, such as bold lines, color, font size and/or style, intermittent on/off display, marching ants, etc., to identify portions of model 300 that are complex (e.g., nonlinear). The display technique may further indicate connections 820 and 840 that convey a complexity from one entity to another entity in model 300. The display techniques can identify all entities and/or connections impacted by complexities or only the entities/connections identified as a source for complexity. Referring to FIG. 8, if the display technique is configured to identify only a source for complexity, SYS2 320 would be indicated using technique 810 since SYS2 320 causes the nonlinear output in model 300. Embodiments can report model complexities using reports, data structures, etc., when desired.

Exemplary Processing for Evaluating A Model

Figure 9:
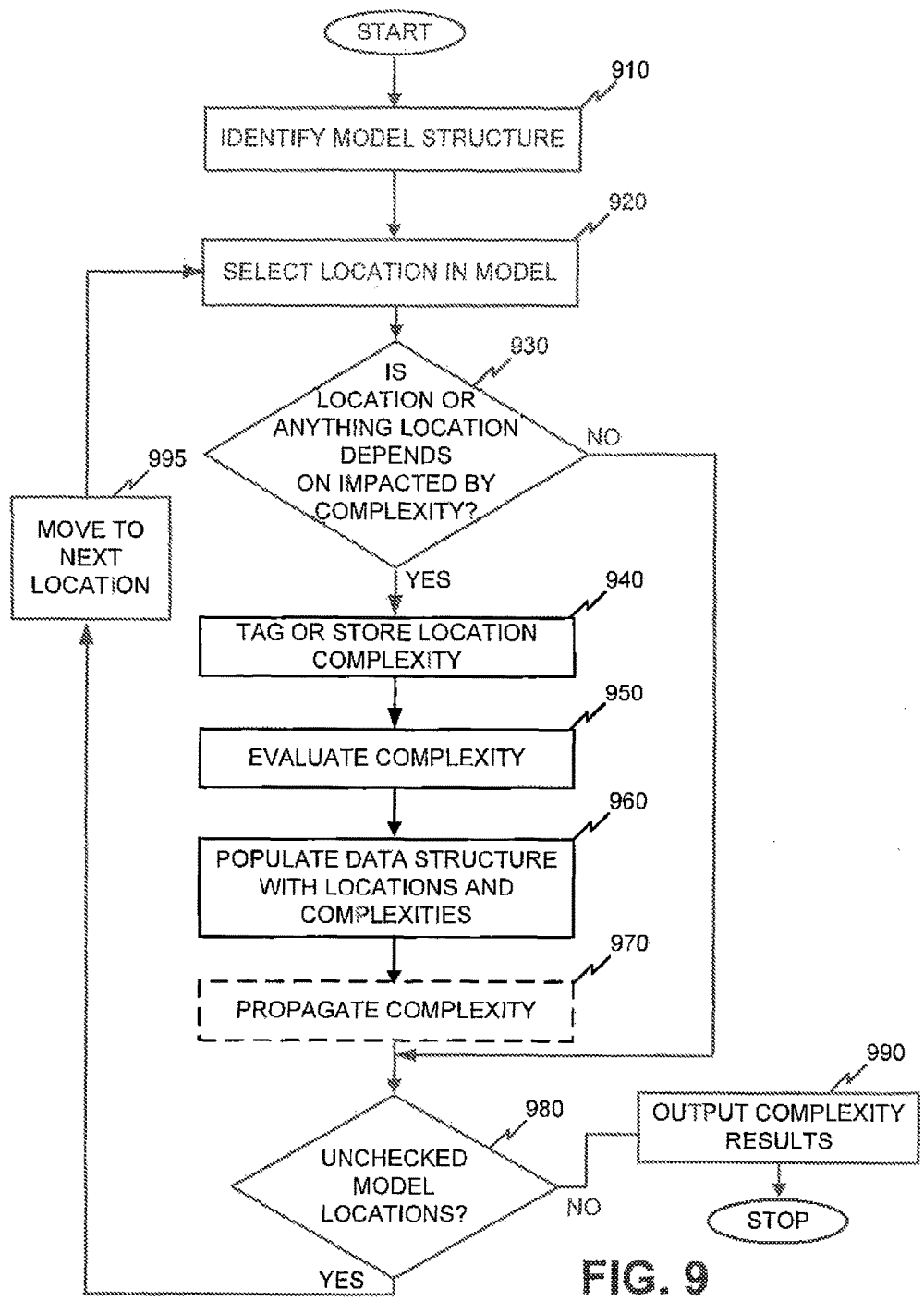
FIG. 9 illustrates exemplary processing for detecting complexities in a model.

FIG. 9 illustrates an exemplary processing technique for performing dependency analyses on a model. The technique illustrated in FIG. 9 includes a technique that can be used to facilitate locating complexities in a model; however, other techniques can be used that may include activities in addition to or in place of the activities shown in FIG. 9.

Processing may begin when evaluation logic 250 identifies the structure of a model (act 910). For example, evaluation logic 250 may identify connections between entities in a model, may identify relationships between entities in the model, may identify types of entities in the model, and/or may determine dependencies among some or all entities in the model. Evaluation logic 250 can further identify types of variables in the model and/or relationships among variables in the model. In an embodiment, evaluation logic 250 can use model structure information when performing complexity analysis and remediation activities on models.

A location in a model may be selected (act 920). When graphical models are used, a group of entities, a single entity, a port associated with an entity, a group of variables, or a single variable may be selected. In textual models, a portion of code may be selected. For the selected location, it may be determined whether complexity impacts the selected location or anything on which the selected location depends (act 930). For example, evaluation logic 250 may evaluate the selected location to determine whether the location receives a nonlinear value, performs a complex operation, whether the location uses a lookup table having a large number of intervals, whether the location is impacted by a timer, counter, or other type of delay, etc. Evaluation logic 250 may also perform these operations for locations having dependencies (e.g., data dependencies) with the selected location, such as an upstream model entity. Additionally, embodiments may use control dependencies to help determine a source of complexity in a model.

When the selected location or a location on which the selected location depends has complexity, the complexity is tagged or stored (act 940). For example, when the selected location is impacted by a nonlinear value, the nonlinear value may be tagged to identify the nonlinear value as a type of model complexity.

Complexity associated with the selected location can be evaluated (act 950). For example, modeling environment 120 may perform an evaluation to determine what type of complexity exists in the model. The evaluation may produce a result that identifies the type of complexity present in the mode, e.g., a nonlinearity, a lookup table, a time delay, etc.

A data structure may be created and used to store information about model locations and complexities associated with those locations. The data structure may be populated with location information for entities impacted by model complexities and about the model complexities present in the model (act 960). The populated data structure can be used by evaluation logic 250 to perform other operations with respect to eliminating model complexities, sent to another device or application, stored in memory, displayed to a user, etc.

In some implementations, it may optionally be desirable to propagate, or push, information about model complexities or to propagate/push the complexities themselves within the model (act 970). For example, evaluation logic 250 may determine that a first block performs a nonlinear operation and is a source for a nonlinear value in a model. The nonlinear value may be used by downstream blocks and may cause the downstream blocks to produce nonlinear values. Evaluation logic 250 may propagate/push information about the nonlinear value, the block causing the nonlinear value, etc., downstream to blocks that share a data dependency with the first block. This may allow other applications, such as an application configured to eliminate model complexities, to quickly identify the source of model complexities.

In some implementations, act 970 may not be included in processing. For example, in a typical implementation, after act 960, evaluation logic 250 may determine whether unchecked model locations are present (act 980). When unchecked locations are present, evaluation logic 250 may index to a next model location (act 995) and may select a next model location (act 920) on which to perform processing as further described in FIG. 9. At act 980, when all model locations have been checked for complexities, model complexity results may be outputted (act 990). For example, complexity results can be output to a user, output to a report, output to another device or application, etc.

The processing of FIG. 9 may further include acts that attempt to identify particular relations in a model. For example, evaluation logic 250 may determine that two variables are sources for model complexity. Evaluation logic 250 may further evaluate relations between the two variables and may identify that one of the variables is a first one on a particular path in the model. Evaluation logic 250 may tag the first variable on the path as the variable that causes the complexity. In an embodiment, evaluation logic 250 may be configured to attempt to fix complexities in the model, such as complexities associated with relations between variables. For example, evaluation logic 250 may attempt to make relations between the two variables discussed above into a piecewise linear relation, where the piecewise linear relation reduces or eliminates the complexity in the model.

The processing of FIG. 9 may include additional acts that eliminate sources of model complexity. For example, the complexity results of act 990 can be used to identify techniques for eliminating the complexities. Assume that complexity results indicate that a multiplier block is nonlinear because it has two varying inputs. Evaluation logic 250 and/or other parts of modeling environment 120 can eliminate this complexity by constraining one of the inputs to the multiplier block, e.g., setting one of the inputs to a constant value or making one of the inputs piecewise linear. Further assume that the complexity results indicate that a lookup table block contains a very large number of intervals and that the large number of intervals is a source model complexity. Evaluation logic 250 or other parts of modeling environment 120 may generate an approximation for the lookup table block by discretizing values in the lookup table so that the approximation includes a fraction of the intervals in the original lookup table block. The approximated lookup table block may eliminate or reduce the complexity associated with the original lookup table. Still further assume that the complexity results indicate that a timer block is causing an excessive amount of delay in a model and that this delay constitutes a source of model complexity. Evaluation logic 250 and/or other parts of modeling environment 120 may eliminate the timer block from the model to eliminate the source of model complexity.

Evaluation logic 250 may be configured to address complexities by identifying a variable in the model that can be made piecewise linear, where making the variable piecewise linear eliminates a complexity associated with a component that receives the variable (e.g., a multiplication block). Replacing the variable with a piecewise linear variable may allow other parts of the model to remain in an original form that may have included complexities, because making the variable piecewise linear may mitigate the affect of the complexities to a degree that model verification activities can be successfully performed without further changes to the model. A user may provide input to evaluation logic 250 to help identify a variable that can be made piecewise linear along a chain of relations among variables in the model. For example, a user may indicate a point along the chain at which to assert that a variable operates on a discrete domain.

The processing of FIG. 9 may further use the results of a complexity evaluation to transform a model containing complexities into an updated model that is free of complexities. For example, an embodiment may perform the acts illustrated in FIG. 9. When act 990 is performed, the results may include transforming the model that was evaluated in FIG. 9 into a new model that does not include complexities. The new model may be used for verification activities and may allow valid verification results to be produced since the new model does not include complexities that might interfere with model verification activities.

If model verification activities are performed while complexities remain in a model, the verification may be unreliable or produce errors. Embodiments described herein can avoid verification problems by performing processing that identifies and eliminates sources of model complexities before model verification activities are performed. For example, the processing activities of FIG. 9 may be performed before the processing activities of FIG. 10A described below.

Exemplary Processing for Verifying A Model

Figure 10A:
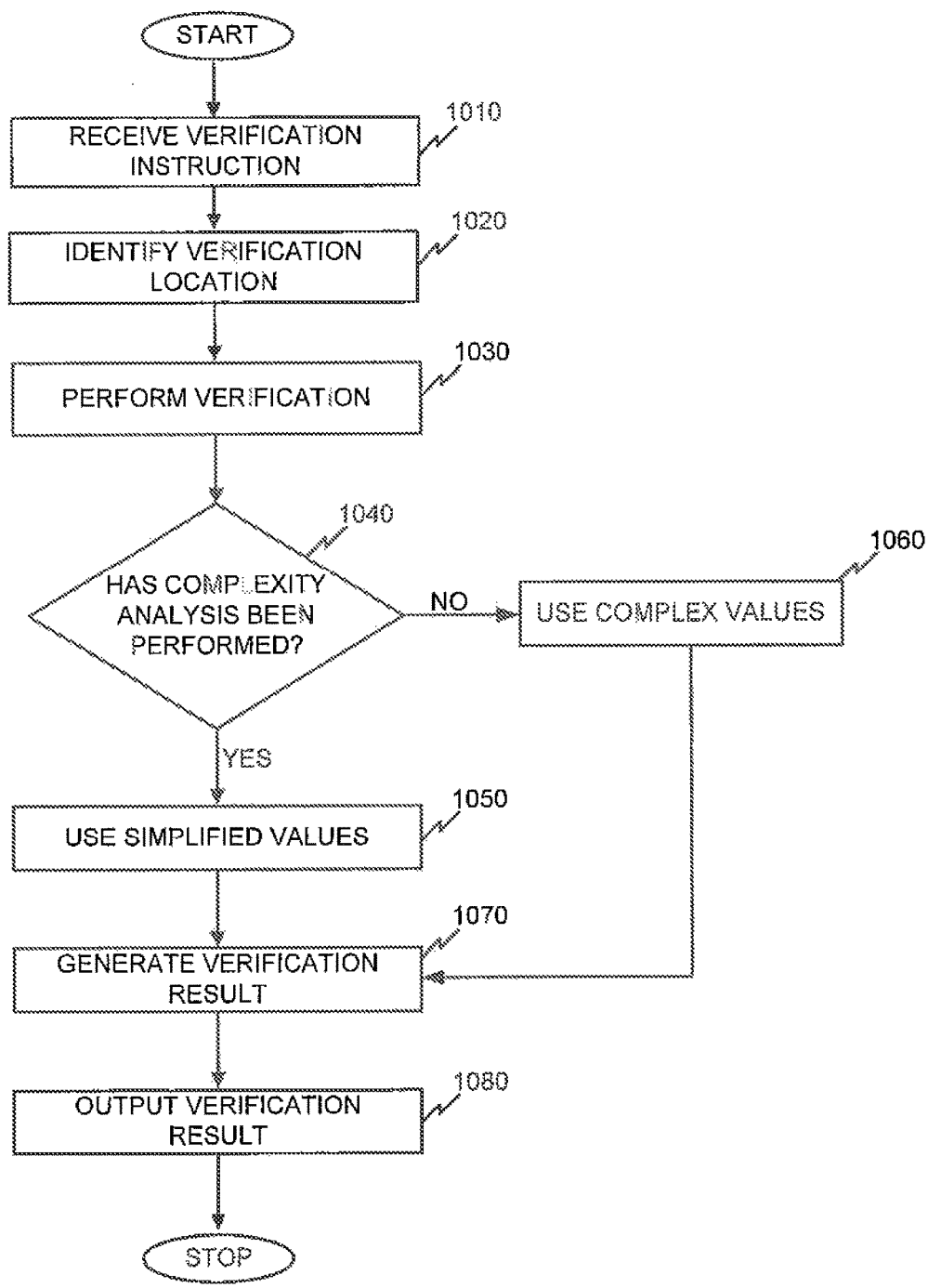
FIG. 10A illustrates exemplary processing for verifying a model.

FIG. 10A illustrates exemplary processing for verifying a model. A verification instruction may be received (act 1010). For example, a user may indicate that a model should be verified by making a selection using input device 125. The user input may be processed by V&V logic 250 and a verification application may be launched within modeling environment 120 on computer 110.

A model location may be identified for which to perform verification (act 1020). For example, the user may specify a particular portion of a model on which to perform verification activities, e.g., a block in model 300. V&V logic 260 may perform verification activities on the specified model location (act 1030). In an embodiment, the verification activities may include evaluating entities sharing a data dependency with the specified model location.

The verification application may determine whether a complexity analysis has been performed on the model for the specified model location (act 1040). For example, the verification application may determine whether the processing acts of FIG. 9 have been performed using evaluation logic 250. When a complexity analysis has not been performed in act 1040, complex values in the model may be used in the verification (act 1060) even though these complex values may produce errors when the verification is performed. When the complex values of act 1060 are used for verification, a verification result may be generated (act 1070).

Returning to act 1040, when it is determined that a complexity analysis was performed; simplified values may be used when the model is verified (act 1050). For example, when a nonlinear value is replaced with a constant value, the constant value is a simplified value as compared to the original nonlinear value. In this example, the simplified value may allow model verification activities to run to completion without producing errors. In contrast, attempting the same verification activities when the nonlinear value remains in the model may produce an error.

A verification result may be generated (act 1070). Embodiments can generate verification results that are intended for use by a user (e.g., text or graphics) or by a machine (e.g., a machine readable data structure). Verification results may be output to a user, an application, a device, etc. (act 1080).

Figure 10B:
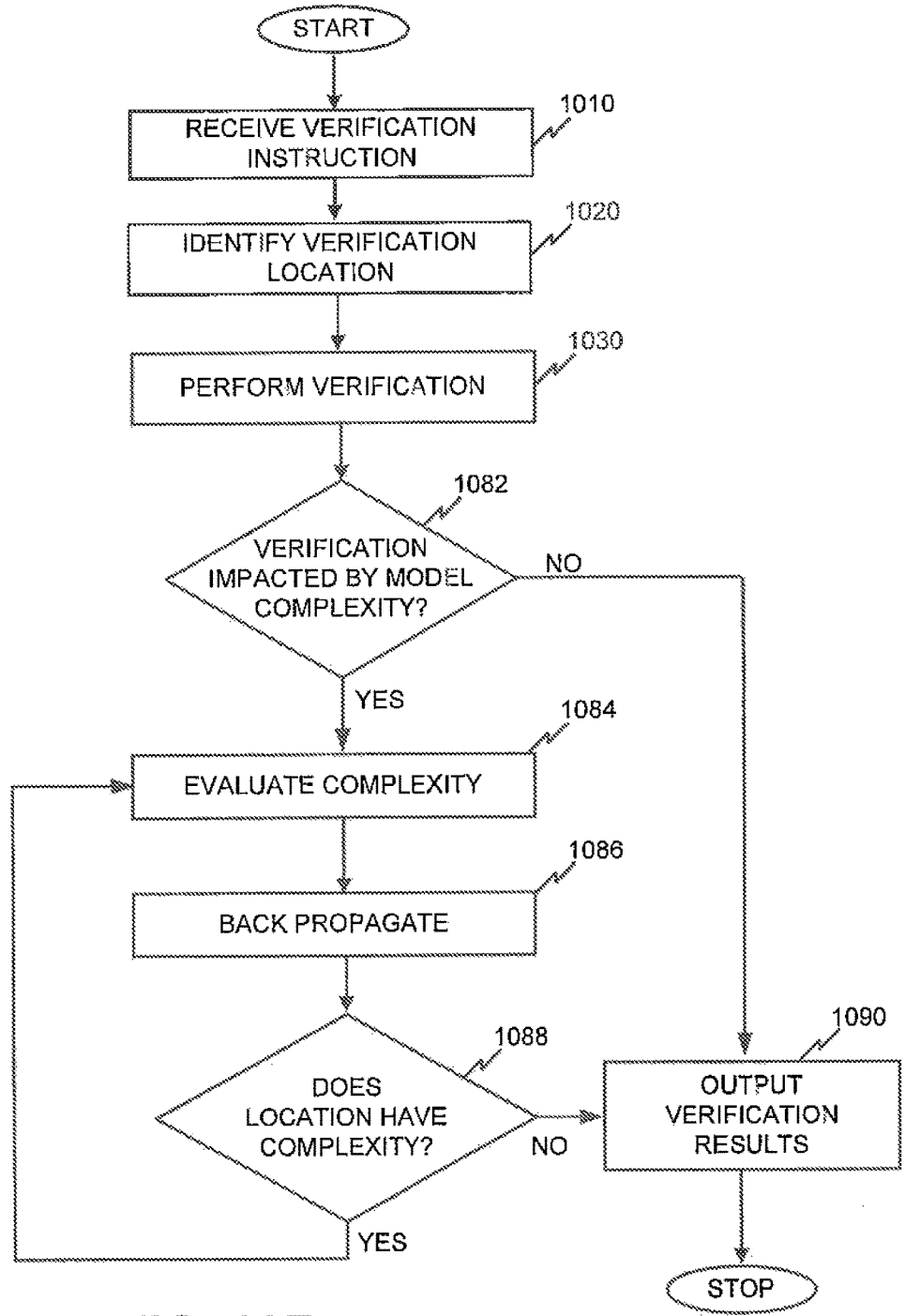
FIG. 10B illustrates exemplary processing that includes back propagation for verifying a model.

The verification activities of FIG. 10A are intended to be illustrative and not limiting as other arrangements of verification activities can be performed without departing from the spirit of the invention. For example, FIG. 10B illustrates another arrangement of verification activities that can be used with a model. Still other activities, not shown in FIG. 10A or 10B, can be used to verify models without departing from the spirit of the invention.

FIG. 10B illustrates exemplary processing for verifying a model by back propagating complexity analysis information. Acts 1010, 1020, and 1030 of FIG. 10B are similar to the corresponding acts of FIG. 10A. V&V logic 250 may determine whether model verification will be impacted by model complexity (act 1082). For example, V&V logic 250 may evaluate a model to identify sources of complexity and when one or more sources are found, V&V logic 250 may determine that the model is impacted by complexity. When the location is not impacted by complexity in act 1082, verification results may be output (act 1090). In contrast, when the model is impacted by complexity in act 1082, the complexity may be evaluated (act 1084). For example, a determination may be made as to what type of complexity exists at a location in the model (e.g., nonlinearity, lookup table, time delay, etc.).

Information about a particular complexity, such as the type of complexity, a block that the complexity is associated with, etc., may be back propagated to another location in a model (act 1086). For example, referring to FIG. 3, V&V logic 250 may determine that a complexity (a nonlinear value) exists at the output of operation1 block 340. V&V logic 250 may back propagate information about the complexity from the output port (OUT 3) of block 340 to an input port (IN 3) of block 340, and upstream to an output port (OUT 1) of SYS2 block 320. V&V logic 250 may determine whether OUT 1 for SYS2 320 includes a complexity (act 1088). Since OUT 1 does have a complexity associated with it (i.e., the block outputs a nonlinear value) processing may return to act 1084 and the complexity for OUT 1 may be evaluated. In contrast, if OUT1 does not have a complexity associated with it at act 1088, verification results can be output (act 1090). The use of back propagating techniques may allow V&V logic 250 to systematically work through a model using data dependencies to identify a source for a complexity in a model. Then the source of the complexity can be removed and model verification activities can be rerun to obtain a valid verification result.

In an embodiment, the evaluation logic 250 may be configured to identify and to reduce complexities caused by lookup tables. In particular, the evaluation logic 250 may apply one or more abstraction techniques to a portion of a graphical model identified as introducing a complexity caused by a lookup table. The evaluation logic 250 may reduce a complexity caused by a lookup table entirely, thereby eliminating the complexity.

A graphical model may include a lookup table block. An exemplary lookup table block includes the N-dimensional Lookup Table block of the Simulink modeling environment from The MathWorks, Inc., as described in the Simulink User's Guide R2013b (Sep. 2013). An N-dimensional Lookup Table block may be used to approximate a function of N variables. It may support the use of one or more interpolation and/or extrapolation methods or algorithms, such as flat, linear, clip, and cubic spline.

A lookup table block may include one or more operations for mapping input data values to output data values. For example, a lookup table block may include or be associated with table data that includes one or more input data sets and output table data. The number of input data sets may determine the dimensionality of the lookup table block, e.g., a single input data set corresponds to a one-dimensional lookup table, two input data sets correspond to a two-dimensional lookup table and so on. The input data sets may be vectors that specify a number of input data values, and the output table data may be an array or matrix of output data values. Each value of an input data set may be referred to as a breakpoint. Table data and breakpoints may be defined through workspace variables.

The table data associated with a lookup table block may approximate a mathematical function over an input data range, such as the function $y=x^3$ over the input range $[-3, 3]$. A lookup table block also may be used to represent data obtained empirically. The lookup table block also may specify operations for interpolating and/or extrapolating output data values for input data values that do not exactly match any of the values of the one or more input data sets. A pair of adjacent values from an input data set may define an interpolation interval of the lookup table. While the use of lookup table blocks in graphical models provides several advantages, they can cause complexities during model verification.

The evaluation logic 250 may be configured to reduce (or eliminate) the complexity caused by a lookup table block by replacing the lookup table block with an approximation. For example, the evaluation logic 250 may be configured to reduce the number of values included in the lookup table block's one or more input data sets and its output table data, thus reducing the size of the block's table data. The evaluation logic 250 may also determine a bound for an error that may result from reducing the table data. For example, the evaluation logic 250 may be configured to analyze the table data associated with a lookup table block, combine two or more interpolation intervals into a single larger interpolation interval thereby reducing one or more breakpoints, and determine one or more bounds for the error of the new table to the original table. This process may be performed iteratively on sets of intervals across one or more table dimensions.

Figure 13:
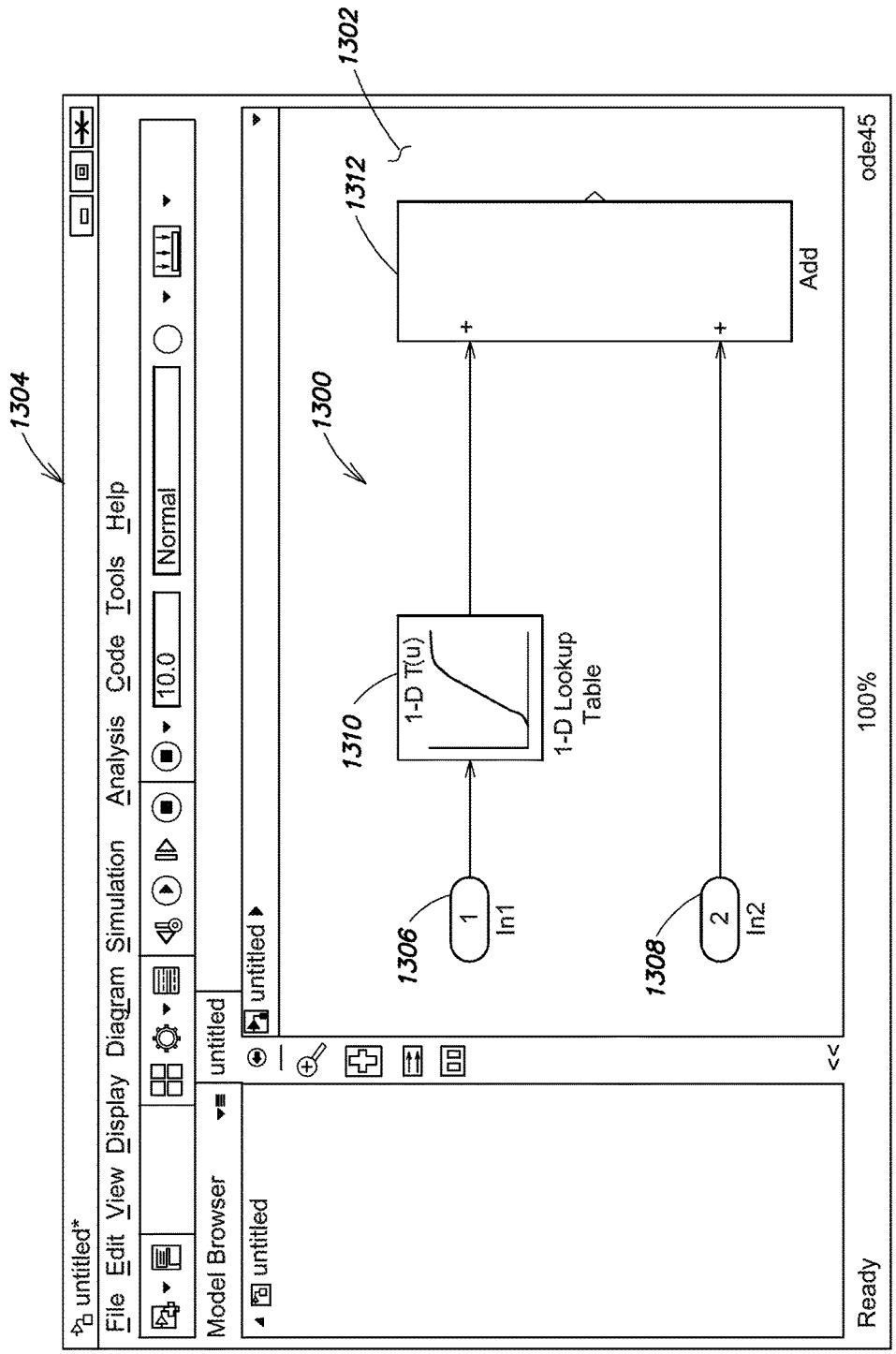
FIG. 13 illustrates an exemplary model having a lookup table that can contribute to model complexities.

FIG. 13 is a schematic illustration of a portion 1300 of a graphical model as presented on a model canvas 1302 of a model editor window 1304. The model portion 1300 may include first and second Inport blocks 1306 and 1308, a one dimensional (1D) Lookup Table block 1310, and an Add block 1312. The 1D Lookup Table block 1310 maps the value from the first Inport block 1306 to an output value. The output value of the 1D Lookup Table block 1310 is obtained by the Add block 1312. The value of the second Inport block 1308 is obtained directly by the Add block 1312. Table data may be associated with the 1D lookup table block 1310, and the table data may represent the function T(u). The input data set vector of the table data may include four values.

Figure 14:
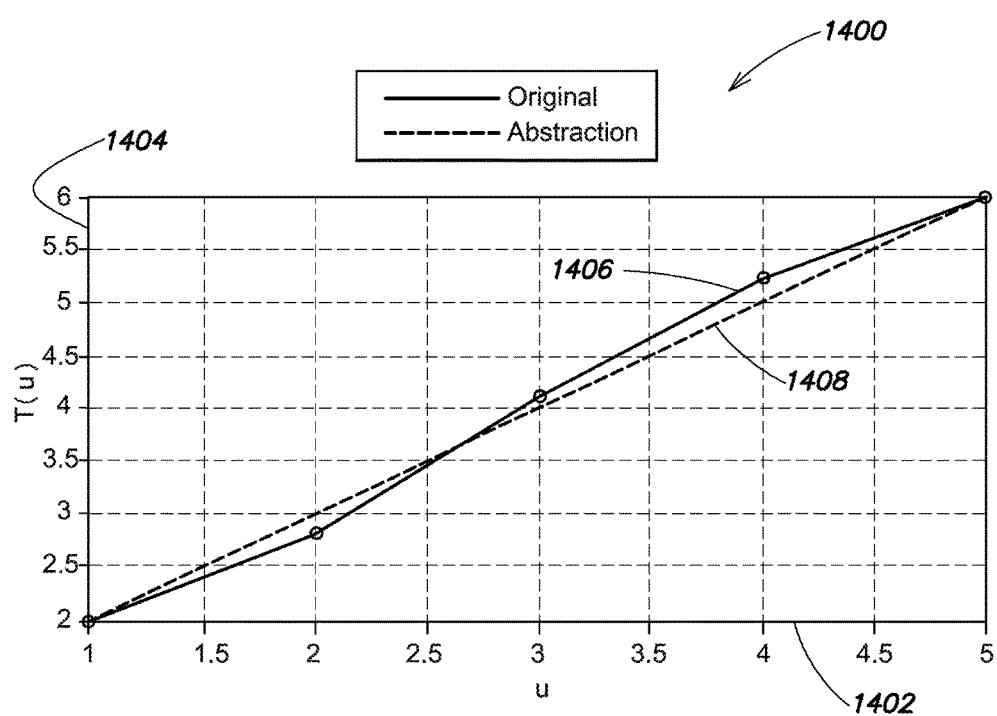
FIG. 14 is a plot of table data of the lookup table of FIG. 13.

FIG. 14 is a schematic illustration of a plot 1400 of at least a portion of the table data associated with the 1D Lookup Table block 1308 (FIG. 13). The plot 1400 includes a horizontal axis 1402 that represents the values of u, and a vertical axis 1404 that represents the values of the function T(u). The table data is represented on the plot 1400 by a solid line 1406. As shown, the table data includes the following sets of input/output values: {1, 2}, {2, 2.8}, {3, 4.1}, {4, 5.2}, and {5, 6}. The evaluation logic 250 may analyze the table data for the 1D Lookup Table block 1310, and determine that it can be made piecewise linear. For example, the evaluation logic 250 may determine that the table data may be approximated using a single linear interval. The single linear interval may extend between two sets of input/output values: {1, 2} and {5, 6}. This linear approximation of the table data is illustrated on the plot 1400 by a dashed line 1408.

The evaluation logic 250 may be configured to apply one or more piecewise linear techniques to approximate the original table data into one or more linear segments. In an embodiment the linearization technique might choose to remove breakpoints in one of the table dimensions so that the resulting linearization is defined by line segments between the breakpoints adjacent to the removed points. In another embodiment, the line segment may be chosen to minimize an error norm across all points in the approximated region, such as the best least square error fit. In addition to providing a piecewise linear approximation of the lookup table data, the evaluation logic 250 also may be configured to determine the resulting error between the linear approximation and the original lookup table data. In an embodiment, for the range of input values, u, the evaluation logic 250 may determine a bound for the resulting error, where the bound may be the largest deviation, both positive and negative, between the output values of the new table data (following the linear approximation) and the output values of the original table data, i.e., T(u).

The evaluation logic 250 may further be configured to automatically create an updated graphical model by applying the approximation to the original graphical model. For example, the evaluation logic 250 may substitute the original lookup table data with the new table data generated through the piecewise linear approximation process. The evaluation logic 250 may also include one or more components to represent the resulting error determined for the piecewise linear approximation.

Figure 15:
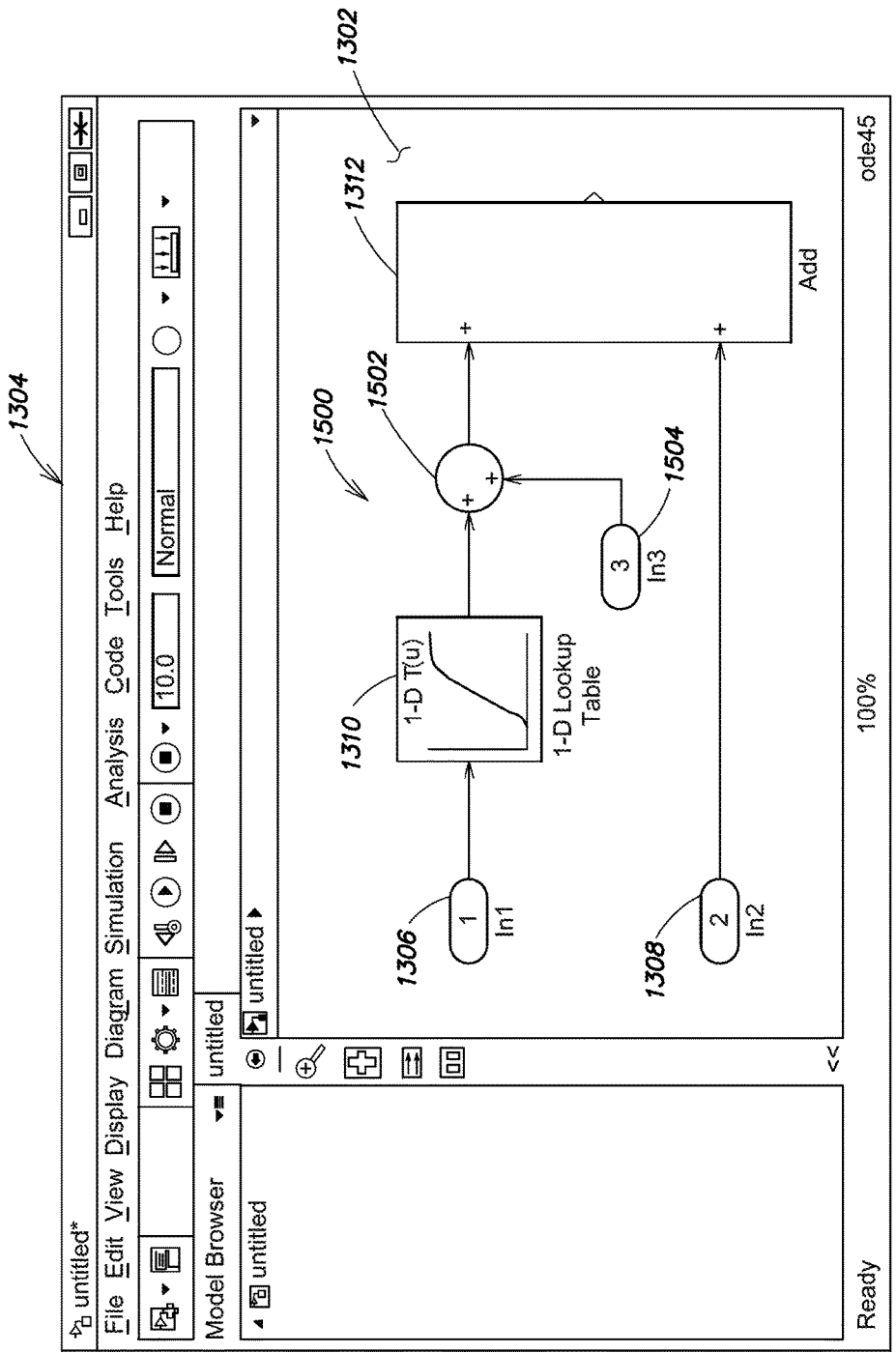
FIG. 15 illustrates an updated version of the model of FIG. 13 where the model complexities are eliminated or reduced.

FIG. 15 is a schematic illustration of an updated graphical model portion 1500 for which the complexity caused by the lookup table block 1310 in the original model portion 1300 has been eliminated or reduced. The updated graphical model 1500 includes the first and second Inport blocks 1306 and 1308, the 1D lookup table block 1310, and the Add block 1312. However, in the updated graphical model portion 1500, the original table data associated with the 1D lookup table block 1310 is replaced with the piecewise linear approximation. The updated graphical model portion 1500 also may include one or more components that account for the bound of the determined error between the piecewise linear approximation and the original table data. For example, the updated graphical model portion 1500 may include an Add block 1502 and a third Inport block 1504. The third Inport block 1504 may represent the resulting error bound which is combined by the Add block 1504 with the output of the 1D lookup table block 1310, and this combination may be provided to the Add block 1312.

Alternatively, the evaluation logic 250 may replace the original 1D Lookup Table block 1310 in the updated graphical model 1500 with a new Lookup Table block that is associated with the linearized table data. In another embodiment, the evaluation logic 250 may be configured to apply the resulting error computed for the linearized table data, rather than a bound for the resulting error.

It should be understood that FIGS. 13-15 are meant for illustrative purposes, and that the present invention may abstract other, possibly more complex, lookup table objects of a graphical model.

The evaluation logic 250 also may be configured to reduce complexities that may be caused by timing features in a graphical model, such as a model that supports dynamic behavior. Specifically, the evaluation logic 250 may be configured to analyze a graphical model, and to identify the occurrence of delays that may cause complexities during model verification. The evaluation logic 250 may be configured to abstract the model's dynamic or timing behavior, thereby eliminating or reducing the complexity. Again, the evaluation logic 250 may reduce a complexity completely, thus eliminating the complexity.

More specifically, the evaluation logic 250 may be configured to identify a portion of a graphical model where an update to an input signal or value causes an update to an output signal or value, but the update to the output signal or value is delayed relative to the update to the input signal or value, for example by two or more model time steps. To identify temporal operations that increase complexity, the evaluation logic 250 may examine an execution schedule constructed for the graphical model, e.g., by a model compiler or interpreter module. The evaluation logic 250 may be configured to identify portions of the model where updates to output values have a temporal dependence on updates to input values. The evaluation logic 250 may also or alternatively look for the presence of temporal operations or other patterns of model constructs that indicate a timing operation. Examples of temporal operations include the "after" command of the Stateflow modeling tool from The MathWorks, Inc., delay blocks of the Simulink modeling environment from The MathWorks, Inc., and the Wait and Wait Until Next functions of the LabVIEW graphical modeling system from National Instruments Corp., among others.

Suppose, for example, that a block of a graphical model delays updating its output signal or value by some number, e.g., 500, of model time steps following the update to an input signal to the block. Such a model portion may cause a complexity because it may require a verification tool to maintain the model's behavior over 500 model time steps before the respective block's output signal or value is updated. The evaluation logic 250 may be configured reduce or eliminate such a complexity by replacing the model portion with an approximation that does not require maintaining the model's behavior throughout the entire delay.

Figure 16:
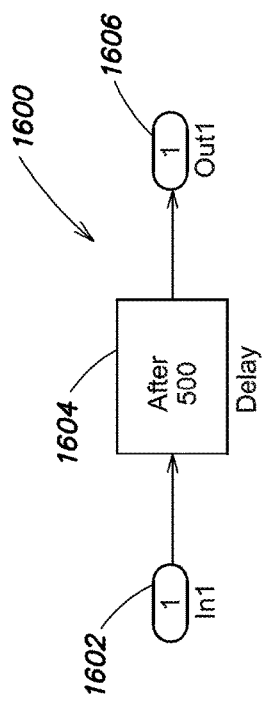
FIG. 16 illustrates an exemplary model having a delay that can contribute to model complexities.

FIG. 16 is a schematic illustration of a portion of a graphical model 1600. The graphical model portion 1600 includes an Inport block 1602, a subsystem block 1604, and an Outport block 1606. The subsystem block 1604 may be configured to read a signal or value from the Inport block 1602, and while that signal or value remains low, e.g., at zero, the subsystem block 1604 may generate a signal or value of zero, which signal or value is read by the Outport block 1606. When the signal or value of the Inport block 1602 goes high, e.g., moves from zero to one, the subsystem block 1604 may be configured to wait a prescribed delay, e.g., 500 model time steps, before also going high, e.g., output a signal or value of one.

Figure 17:
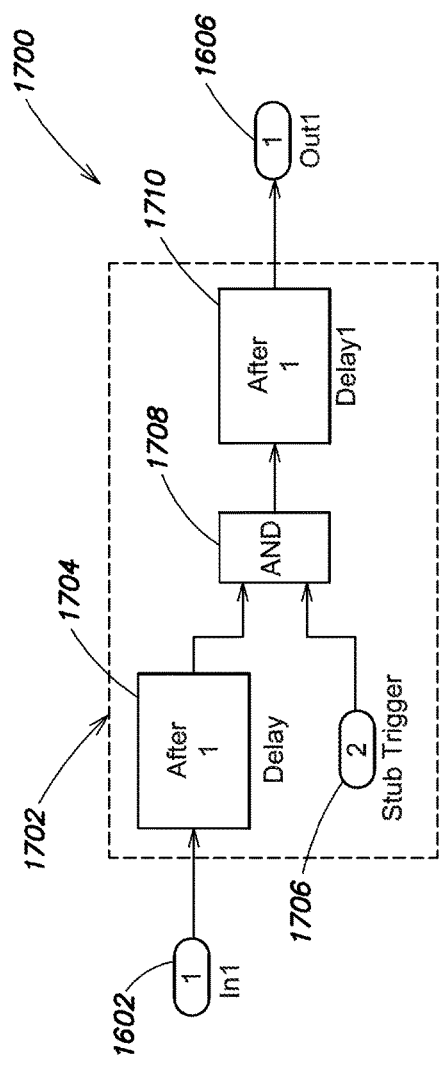
FIG. 17 illustrates an updated version of the model of FIG. 16 where the complexities are eliminated or reduced.

FIG. 17 is a schematic illustration of an updated portion of a graphical model 1700. The updated model portion 1700 may be automatically generated by the evaluation logic 250. Like the original model portion 1600, the updated model portion 1700 includes the Inport block 1602 and the Outport block 1606. In place of the subsystem block 1604 of the original model portion 1600, however, the updated model portion 1700 includes an abstraction 1702. The abstraction 1702 may include one or more components. The updated model portion defines a set of behaviors that include the delay behavior of the original model and is therefore a generalization of the original model.

For example, the abstraction 1702 may include a first subsystem block 1704, a stub trigger block 1706, a logical AND block 1708, and a second subsystem block 1710. The first subsystem block 1704 may be configured to read the signal or value of the Inport block 1602. The AND block 1708 may be configured to read the output signal or value of the first subsystem block 1704 and the output signal or value of the stub trigger block 1706, and if both signals or values are True, also outputs True. Otherwise, the AND block 1708 outputs False. The second subsystem block 1710 reads the output signal or value of the AND block 1708, and the Outport block 1606 reads the output signal or value of the second subsystem block 1710.

The evaluation logic 250 may configure the first subsystem block 1704 to output False while the signal or value of the Inport block 1602 remains low, e.g., at zero, and to output True when the signal or value of the Inport block 1602 goes from low to high, e.g., from zero to one. The evaluation logic 250 may configure the second subsystem block 1710 so that, while the output signal or value of the AND block 1708 is False, the second subsystem block 1710 outputs a low signal or value, e.g., zero, and when the output signal or value of the AND block 1708 is True, the second subsystem block 1710 outputs a high signal or value, e.g., one.

The updated model portion 1700 thus approximates the behavior of the original model portion 1600 without having to maintain 500 model time steps of system behavior, which may cause a complexity during model verification. While the subsystem block 1604 of the original graphical model 1600 defined a long and precise delay, i.e., 500 model time steps, in the abstraction 1702, the delay is an unknown variable, N, by virtue of the stub trigger block 1706. If verification using the abstraction 1702 is successful for any value N, then verification is also successful for the specific case of N=500, thereby proving the original graphical model 1600 to be valid without having to wait the precise delay included in the original graphical model 1600.

The evaluation logic 250 may be configured to use the same form of updated model portion as illustrated in FIG. 17 to abstract delay behaviors identified in other source graphical models. Nonetheless, the evaluation logic 250 may tailor the behavior of the first subsystem block 1704, the stub trigger block 1706, and the second subsystem block 1710 based on delay behaviors of the other source graphical models. In other words, FIGS. 16 and 17 are meant for illustrative purposes only and the present invention may abstract other, possibly more complex, delay behaviors of an original graphical model Many classes of temporal operations may be identified by using a dependency analysis on the variables that represent memory, e.g., variables that hold their value from one model time step to another. The temporal operation may be indicated by a recurrence relationship, such as $x=x+C$, where C is a constant and x is a memory variable that is used by one or more predicates in a model, such as if $x>100$. In fixed-step discrete algorithms, temporal operations may correspond to counting operations within a controller representation. The evaluation logic 250 may be configured to analyze a model and compose its Static Single Assignment (SSA) form. The evaluation logic 250 may then utilize the SSA form to directly identify recurrence equations related to counting operations, thereby identifying temporal operations within the model. Next, the evaluation logic 250 may abstract one or more of the identified temporal operations, for example by automatically generating an abstraction in which a precise temporal operation is replaced with an unknown variable.

Exemplary Architecture

Figure 11:
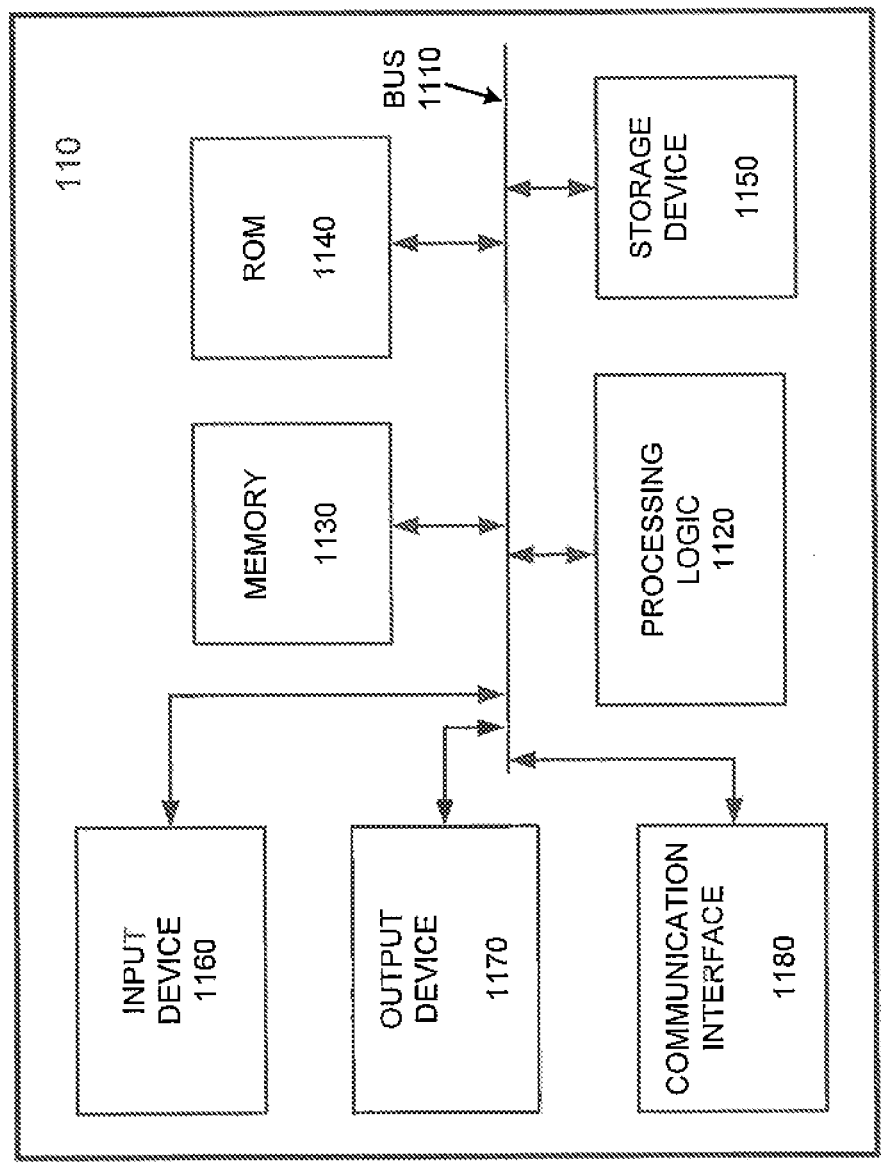
FIG. 11 illustrates an exemplary processing architecture that can be used to implement an embodiment of the invention.

FIG. 11 illustrates an exemplary computer architecture that can be used to implement computer 110 of FIG. 1. FIG. 11 is an exemplary diagram of an entity corresponding to computer 110. As illustrated, the entity may include a bus 1110, processing logic 1120, a main memory 1130, a read-only memory (ROM) 1140, a storage device 1150, an input device 1160, an output device 1170, and/or a communication interface 1180. Bus 1110 may include a path that permits communication among the components of the entity.

Processing logic 1120 may include a processor, microprocessor, or other types of processing logic (e.g., field programmable gate array (FPGA), graphics processing unit (GPU), digital signal processor (DSP), application specific integrated circuit (ASIC), etc.) that may interpret and execute instructions. For an implementation, processing logic 1120 may include a single core processor or a multi-core processor. In another implementation, processing logic 1120 may include a single processing device or a group of processing devices, such as a processing cluster or computing grid. In still another implementation, processing logic 1120 may include multiple processors that may be local or remote with respect each other, and may use one or more threads while processing.

Main memory 1130 may include a random access memory (RAM) or another type of dynamic storage device that may store information and instructions for execution by processing logic 1120. ROM 1140 may include a ROM device or another type of static storage device that may store static information and/or instructions for use by processing logic 1120. Storage device 1150 may include a magnetic, solid state and/or optical recording medium and its corresponding drive, or another type of static storage device that may store static information and/or instructions for use by processing logic 1120.

Input device 1160 may include logic that permits an operator to input information to the entity, such as a keyboard, a mouse, a pen, a touchpad, an accelerometer, a microphone, voice recognition, camera, neural interface, biometric mechanisms, etc. In an embodiment, input device 1160 may correspond to input device 125.

Output device 1170 may include a mechanism that outputs information to the operator, including a display, a printer, a speaker, a haptic interface, etc. Communication interface 1180 may include any transceiver-like logic that enables the entity to communicate with other devices and/or systems. For example, communication interface 1180 may include mechanisms for communicating with another device or system via a network.

The entity depicted in FIG. 11 may perform certain operations in response to processing logic 1120 executing software instructions stored in a computer-readable storage medium, such as main memory 1130. A computer-readable storage medium may be defined as a physical or logical memory device. The software instructions may be read into main memory 1130 from another computer-readable storage medium, such as storage device 1150, or from another device via communication interface 1180. The software instructions contained in main memory 1130 may cause processing logic 1120 to perform techniques described herein when the software instructions are executed on processing logic. Alternatively, hardwired circuitry may be used in place of or in combination with software instructions to implement techniques described herein. Thus, implementations described herein are not limited to any specific combination of hardware circuitry and software.

Although FIG. 11 shows exemplary components of the entity, in other implementations, the entity may contain fewer, different, or additional components than depicted in FIG. 11. In still other implementations, one or more components of the entity may perform one or more tasks described as being performed by one or more other components of the entity.

Exemplary Distributed Embodiment

Distributed embodiments may perform processing using two or more processing resources. For example, embodiments can perform processing using two or more cores in a single processing device, distribute processing across multiple processing devices installed within a single enclosure, and/or distribute processing across multiple types of processing logic connected by a network.

Figure 12:
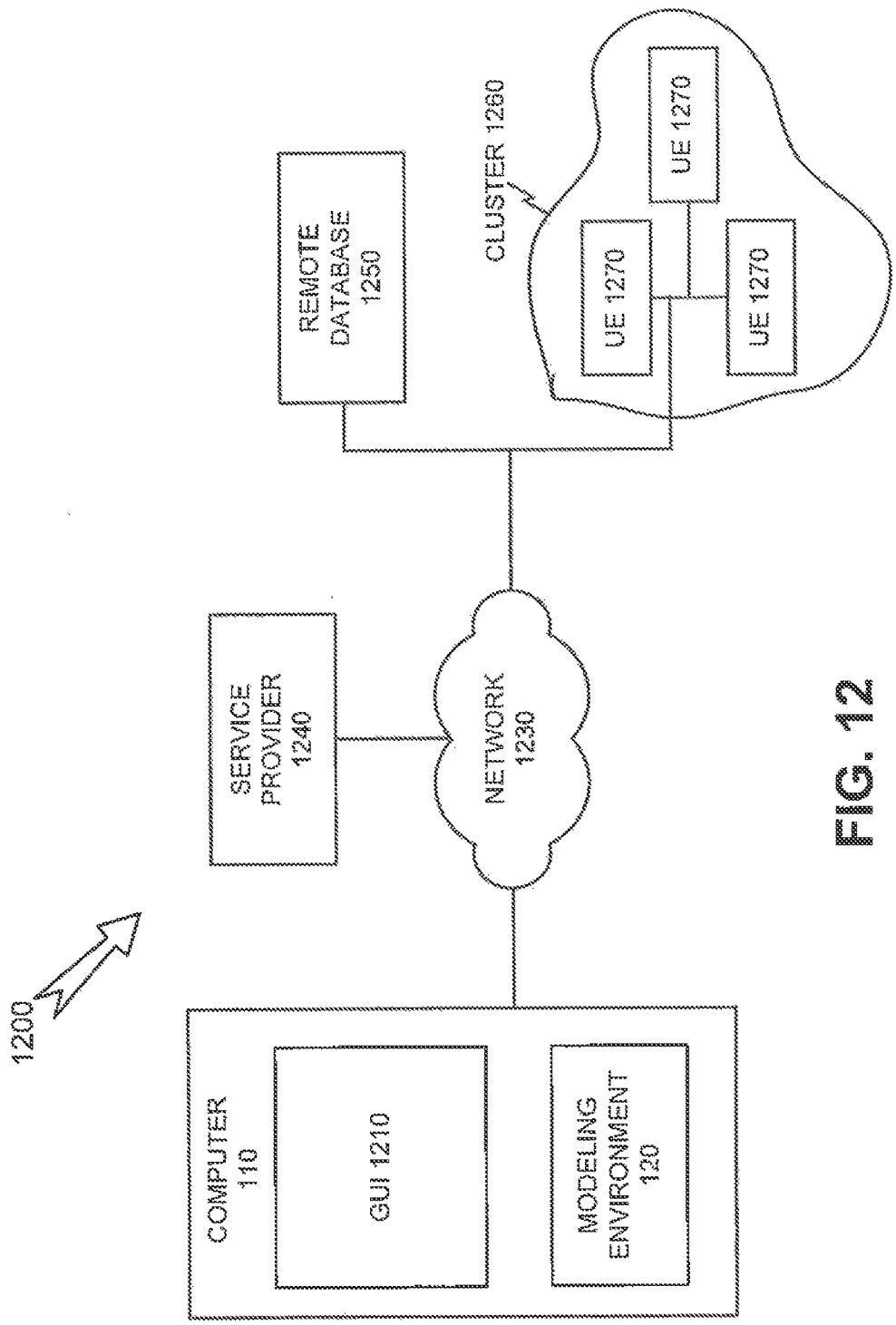
FIG. 12 illustrates an exemplary architecture for implementing a distributed implementation of the invention.

FIG. 12 illustrates an exemplary system that can analyze models, eliminate complexities in the models, and perform verification analyses on behalf of a client device (e.g., computer 110) using a distributed computing environment. System 1200 may include computer 110, network 1230, service provider 1240, remote database 1250 and cluster 1260. The implementation of FIG. 12 is exemplary and other distributed implementations of the invention may include more devices and/or entities, fewer devices and/or entities, and/or devices/entities in configurations that differ from the exemplary configuration of FIG. 12.

Computer 110 may include graphical user interface (GUI) 1210 and modeling environment 120. GUI 1210 may include an interface that allows a user to interact with computer 110 and/or remote devices (e.g., service provider 1240). In an exemplary embodiment, GUI 1210 may be similar to the interfaces of FIGS. 1, 4, 6A, 6B and 8.

Network 1230 may include any network capable of transferring data (e.g., packet data or non-packet data). Implementations of network 1230 may include local area networks (LANs), metropolitan area networks (MANs) and/or wide area networks (WANs), such as the Internet, that may operate using substantially any network protocol, such as Internet protocol (IP), asynchronous transfer mode (ATM), synchronous optical network (SONET), user datagram protocol (UDP), IEEE 802.10, etc.

Network 1230 may include network devices, such as routers, switches, firewalls, and/or servers (not shown). Network 1230 may be a hardwired network using wired conductors and/or optical fibers and/or may be a wireless network using free-space optical, radio frequency (RF), and/or acoustic transmission paths. In an implementation, network 1230 may be a substantially open public network, such as the Internet. In another implementation, network 1230 may be a more restricted network, such as a corporate virtual network. Implementations of networks and/or devices operating on networks described herein are not limited to any particular data type, protocol, architecture/configuration, etc. For example, in an embodiment, network 1230 may be a quantum network that uses quantum-compatible networking protocols.

Service provider 1240 may include a device that makes a service available to another device. For example, service provider 1240 may include an entity that provides one or more services to a destination using a server and/or other devices. Services may include instructions that are executed by a destination to perform an operation. Alternatively, a service may include instructions that are executed on behalf of a destination to perform an operation on the destination's behalf.

Assume, for sake of example, that a service provider operates a web server that provides one or more web-based services to a destination, such as computer 110. The web-based services may allow computer 110 to perform distributed simulations of electrical and/or mechanical systems using hardware that is operated by the service provider. For example, a user of computer 110 may be allowed to evaluate models to remove complexities and/or to perform verification activities using the service provider's hardware. In an implementation, a customer (user) may receive services on a subscription basis. A subscription may include substantially any type of arrangement, such as monthly subscription, a per-use fee, a fee based on an amount of information exchanged between service provider 1240 and the customer, a fee based on a number of processor cycles used by the customer, a fee based on a number of processors used by the customer, etc.

Remote database 1250 may include a device that stores machine-readable information for use by other devices, such as computer 110. In an embodiment, remote database 1250 may include an array or grid of storage devices (e.g., hard disks, optical disks, solid-state storage devices, etc.) that store data structures containing information about model complexities, verification results, etc.

Cluster 1260 may include a group of processing devices, such as units of execution 1270 that can be used to perform remote processing (e.g., distributed processing, parallel processing, etc.). Units of execution 1270 may include hardware and/or hardware/software based devices that perform processing operations on behalf of a requesting device, such as computer 110. In an embodiment, units of execution 1270 may each compute a partial result and the partial results can be combined into an overall result for a model.

Embodiments operating in a standalone or in a distributed implementation can perform activities described herein on code associated with text-based computing and/or modeling applications, such as, but not limited to, MATLAB® by The MathWorks, Inc.; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim.

Embodiments can further perform activities described herein on code associated with graphical modeling environments, such as, but not limited to, Simulink®, Stateflow®, SimEvents™, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from International Business Machines (IBM) Corporation; Ptolemy from the University of California at Berkeley; ASCET, CoWare, or aspects of a Unified Modeling Language (UML) or SysML environment.

Graphical modeling environments can include block diagrams and/or other types of diagrams.

Embodiments may be implemented in a variety computing environments, such as environments that support statically or dynamically typed programming languages. For example, a dynamically typed language may be one used to express problems and/or solutions in mathematical notations familiar to those of skill in the relevant arts. For example, the dynamically typed language may use an array as a basic element, where the array may not require dimensioning. These arrays may be used to support array programming in that operations can apply to an entire set of values, such as values in an array. Array programming may allow array based operations to be treated as a high-level programming technique or model that lets a programmer think and operate on whole aggregations of data without having to resort to explicit loops of individual non-array, i.e., scalar operations. An exemplary embodiment that uses a dynamically typed language may be implemented in the Embedded MATLAB programming language that can be used to create code for use in embedded applications.

Conclusion

Implementations may reduce or eliminate complexities from models having executable semantics and may perform verification activities on the models once the complexities have been eliminated or reduced.

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, while a series of acts has been described with regard to FIGS. 9, 10A and 10B, the order of the acts may be modified in other implementations consistent with the principles of the invention. Further, non-dependent acts may be performed in parallel.

In addition, implementations consistent with principles of the invention can be implemented using devices and configurations other than those illustrated in the figures and described in the specification without departing from the spirit of the invention. For example, devices and/or entities may be added and/or removed from the implementations of FIG. 1, 2, 11, or 12 depending on specific deployments and/or applications. Further, disclosed implementations may not be limited to any specific combination of hardware.

Further, certain portions of the invention may be implemented as "logic" that performs one or more functions. This logic may include hardware, such as hardwired logic, an application-specific integrated circuit, a field programmable gate array, a microprocessor, software, or a combination of hardware and software.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

Headings and sub-headings used herein are to aid the reader by dividing the specification into subsections. These headings and sub-headings are not to be construed as limiting the scope of the invention or as defining the invention.

The scope of the invention is defined by the claims and their equivalents.

What is claimed is:

1. A method comprising:
   detecting, by a first processor, at least one complexity in a model including executable semantics,
      the at least one complexity interfering with a verification of the model;
   identifying a source for the at least one complexity,
      the source being a lookup table of the model,
      the lookup table including table data that includes at least one input data set, and
      the at least one input data set including a number of input data values; and
   reducing the source for the at least one complexity, thereby allowing successful verification of the model, the reducing including:
      generating, by the first or a second processor, new table data for the lookup table, the generating including:
         linearizing at least a portion of the table data of the lookup table, where the linearizing reduces the number of input data values of the at least one input data set of the lookup table; and
         replacing the table data of the lookup table with the new table data.

2. The method of claim 1 wherein the lookup table includes an output, the method further comprising:
   determining an error between the table data and the new table data; and
   utilizing the error during the verification of the model.

3. The method of claim 2 further comprising:
   determining a bound for the error between the table data and the new table data; and
   using the bound for the error as an unknown input during the verification of the model to verify an aspect of the model.

4. The method of claim 1 further comprising:
   generating an updated model having executable semantics, the updated model based on the model, and
      including the new table data for the lookup table,
   wherein the at least one complexity is eliminated in the updated model.

5. The method of claim 1 wherein the model is one or more of:
   a time-based model,
   a state transition model,
   a data flow model,
   an event based model,
   an entity flow diagram, or
   a Unified Modeling Language (UML) diagram.

6. A non-transitory, computer-readable medium comprising program instructions, the program instructions when executed by processing logic operable to:
   detect at least one complexity in a model including executable semantics, the at least one complexity interfering with a verification of the model;
   identify a source for the at least one complexity,
      the source including a lookup table of the model,
      the lookup table including table data that includes at least one input data set, and
      the at least one input data set including a number of input data values; and
   reduce the source for the at least one complexity, thereby allowing successful verification of the model, the reduce including:
      generate new table data for the lookup table, the generate including:

linearize at least a portion of the table data of the lookup table, where the linearize reduces the number of input data values of the at least one input data set of the lookup table; and replace the table data of the lookup table with the new table data.

7. The non-transitory computer readable medium of claim 6 wherein the lookup table includes an output, the medium further comprising program instructions to:

determine an error between the table data and the new table data; and utilize the error during the verification of the model.

8. The non-transitory computer readable medium of claim 7 further comprising program instructions to:

determine a bound for the error between the table data and the new table data; and use the bound for the error as an unknown input during the verification of the model to verify an aspect of the model.

9. The non-transitory computer readable medium of claim 6 further comprising program instructions to:

generate an updated model including executable semantics, the updated model based on the model; and include the new table data for the lookup table in the updated model, wherein the at least one complexity is eliminated in the updated model.

10. The non-transitory computer readable medium of claim 6 wherein the model is one or more of:

a time-based model, a state transition model, a data flow model, an event based model, an entity flow diagram, or a Unified Modeling Language (UML) diagram.

11. An apparatus comprising:

an output device; and processing logic coupled to the output device, the processing logic configured to:

detect at least one complexity in a model including executable semantics, the at least one complexity interfering with a verification of the model;

identify a source for the at least one complexity, the source including a lookup table of the model, the lookup table including table data that includes at least one input data set, and the at least one input data set including a number of input data values;

reduce the source for the at least one complexity, thereby allowing successful verification of the model, the reduce including:

generate new table data for the lookup table, the generate including:

linearize at least a portion of the table data of the lookup table, where the linearize reduces the number of input data values of the at least one input data set of the lookup table; and replace the table data of the lookup table with the new table data; and present one or more results of complexity reduction activities at the output device.

12. The apparatus of claim 11 wherein the lookup table includes an output, the processing logic further configured to:

determine an error between the table data and the new table data; and utilize the error during the verification of the model.

13. The apparatus of claim 12 wherein the processing logic is further configured to:

determine a bound for the error between the table data and the new table data; and use the bound for the error as an unknown input during the verification of the model to verify an aspect of the model.

14. The apparatus of claim 11 wherein the processing logic is further configured to:

generate an updated model including executable semantics, the updated model based on the model; and include the new table data for the lookup table in the updated model, wherein the at least one complexity is eliminated in the updated model.

15. The apparatus of claim 11 wherein the model is one or more of:

a time-based model, a state transition model, a data flow model, an event based model, an entity flow diagram, or a Unified Modeling Language (UML) diagram.

16. A method comprising:

detecting, by a first processor, at least one complexity in a model including executable semantics, the at least one complexity interfering with a verification of the model;

identifying a source for the at least one complexity, the source including a temporal operation in the model, the temporal operation being between an update to an input of an element of the model and an update to an output of the element of the model;

reducing the source for the at least one complexity, by the first or a second processor, the reducing including:

abstracting the temporal operation; and performing verification of the model.

17. The method of claim 16 wherein the abstracting the temporal operation includes:

generating an updated model, the updated model based on the model; and including a stub input configured to trigger the update to the output of the element at an unspecified time.

18. The method of claim 17 wherein the model is configured to simulate a dynamic system.

19. The method of claim 17 wherein the model is a time-based, graphical model.

20. The method of claim 16 wherein the element is a block of the model.

21. A non-transitory, computer readable medium comprising program instructions, the program instructions when executed by processing logic operable to:

detect at least one complexity in a model having executable semantics, the at least one complexity interfering with a verification of the model;

identify a source for the at least one complexity, the source including a temporal operation in the model, the temporal operation being between an update to an input of an element of the model and an update to an output of the element of the model;

eliminate the source for the at least one complexity, the eliminate including:

abstract the temporal operation; and perform verification of the model.

22. The non-transitory, computer readable medium of claim 21 wherein the abstract the temporal operation includes:
- generate an updated model, the updated model based on the model; and
- include a stub input configured to trigger the update to the output of the element at an unspecified time.

23. The non-transitory, computer readable medium of claim 22 wherein the model is configured to simulate a dynamic system.

24. The non-transitory, computer readable medium of claim 21 wherein the model is a time-based, graphical model.

25. The non-transitory, computer readable medium of claim 21 wherein the element is a block of the model.

* * * * *